(12) United States Patent
Aiso

(10) Patent No.: US 8,207,587 B2
(45) Date of Patent: Jun. 26, 2012

(54) MAGNETIC SENSOR AND MANUFACTURING METHOD THEREFOR

(75) Inventor: Kokichi Aiso, Hamamatsu (JP)

(73) Assignee: Yamaha Corporation, Hamamatsu-Shi (JP)

( * ) Notice: Subject to any disclaimer, the term of this patent is extended or adjusted under 35 U.S.C. 154(b) by 565 days.

(21) Appl. No.: 12/137,199

(22) Filed: Jun. 11, 2008

(65) Prior Publication Data

US 2008/0316654 A1 Dec. 25, 2008

(30) Foreign Application Priority Data

Jun. 13, 2007 (JP) ................. 2007-156378

(51) Int. Cl.
*H01L 29/82* (2006.01)
(52) U.S. Cl. . 257/421; 257/414; 257/427; 257/E43.004; 438/3
(58) Field of Classification Search .......... 257/414, 257/421, 427, E43.001, E43.004; 438/3
See application file for complete search history.

(56) References Cited

U.S. PATENT DOCUMENTS

2002/0006530 A1    1/2002    Ide et al.

FOREIGN PATENT DOCUMENTS

| CN | 2006-308544 | 11/2006 |
|---|---|---|
| JP | 10-313138 A | 11/1998 |
| JP | 10-321435 A | 12/1998 |
| JP | 2001-184613 | 7/2001 |
| JP | 2001-291915 A | 10/2001 |
| JP | 2003-204092 A | 7/2003 |
| JP | 2003-243630 A | 8/2003 |
| JP | 2004-006752 A | 1/2004 |
| JP | 2006-032710 A | 2/2006 |
| JP | 2006-261400 A | 9/2006 |
| JP | 2006-308544 | 11/2006 |

OTHER PUBLICATIONS

Machine Translation of JP-2006-261400.*
Machine Translation of JP-2001-184613.*
Japanese Office Action issued for application JP 2007-156378, mail date Oct. 18, 2011 (English translation attached).

* cited by examiner

*Primary Examiner* — Julia Slutsker
(74) *Attorney, Agent, or Firm* — Dickstein Shapiro LLP

(57) ABSTRACT

A magnetic sensor for detecting magnetism in two-axial directions or three-axial directions is constituted of a substrate, a silicon oxide film that is formed on the substrate so as to form the planar surface and slopes, a plurality of magnetoresistive elements, each of which is formed by laminating a free layer, a conductive layer, and a pin layer on the substrate, a plurality of lead films that are formed to connect the magnetoresistive elements in series, a CVD oxide film for covering the magnetoresistive elements, and a non-magnetic film that is formed between the magnetoresistive elements and the CVD oxide film so as to cover the periphery of the free layer with respect to each magnetoresistive element. Thus, it is possible for the magnetic sensor to include the magnetoresistive elements having superior hysteresis characteristics.

1 Claim, 15 Drawing Sheets

MAGNETIC SENSOR AND MANUFACTURING METHOD THEREFOR

BACKGROUND OF THE INVENTION

1. Field of the Invention

The present invention relates to magnetic sensors, in which giant magnetoresistive elements are formed on a single substrate so as to detect intensities of magnetic fields in two-axial directions and three-axial directions. The present invention also relates to manufacturing methods of magnetic sensors.

This application claims priority on Japanese Patent Application No. 2007-156378, the content of which is incorporated herein by reference.

2. Description of the Related Art

Conventionally, giant magnetoresistive elements (GMR elements) and tunnel magnetoresistive elements (TMR elements) have been know as elements for use in magnetic sensors. Each of these magnetoresistive elements includes a pin layer whose magnetization direction is fixed (or pinned) and a free layer whose magnetization direction varies in response to an external magnetic field, wherein it produces a resistance based on the relativity between the magnetization direction of the pin layer and the magnetization direction of the free layer. Magnetic sensors using magnetoresistive elements have been disclosed in various documents such as Patent Document 1.

Patent Document 1: Japanese Unexamined Patent Application Publication No. 2006-261400.

Patent Document 1 teaches a magnetic sensor in which magnetoresistive elements are formed on planar surfaces and slopes (or inclines that are inclined to planar surfaces) on a single substrate, thus detecting intensities of magnetic fields in two-axial directions and three-axial directions.

In order to improve ferromagnetism resistance of pin layers, magnetic sensors have been recently developed using giant magnetoresistive elements having synthetic antiferromagnetic (SAF) structures, in which Ru layers (where Ru stands for ruthenium) are incorporated in magnetic layers of pin layers.

The aforementioned giant magnetoresistive elements form multiple band-shaped giant magnetoresistive films (referred to as GMR bars), in which specific materials for use in pin layers and free layers are exposed on the periphery thereof. For this reason, in order to secure water resistance, heat resistance, and electric insulation, protection films (or passivation films) including oxide films and nitride films are formed by way of plasma chemical vapor deposition (i.e. plasma CVD).

In the formation of oxide films for protecting giant magnetoresistive elements by way of plasma CVD, giant magnetoresistive elements may absorb active oxygen existing in chambers. When giant magnetoresistive elements absorb oxygen, they may be locally oxidized. This drawback also occurs in the formation of protection films for coating tunnel magnetoresistive elements by way of plasma CVD.

When materials for use in free layers of GMR bars including giant magnetoresistive elements are oxidized, free layers are degraded in weak magnetic characteristics; this makes it difficult to precisely produce resistances based on magnetization directions of free layers. This also increases hysteresis loops of magnetism, thus degrading hysteresis characteristics of magnetic sensors. This drawback occurs with respect to giant magnetoresistive elements formed on planar surfaces and slopes; in particular, it remarkably occurs with respect to giant magnetoresistive elements formed on slopes.

GMR bars are formed using giant magnetoresistive elements by way of ion milling, wherein, within exposed peripheral portions of GMR bars, their side portions lying along longitudinal directions are inclined (or semi-tapered) to substrates. Within GMR bars composed of giant magnetoresistive elements formed on slopes, upward GMR bars (formed on upward slopes) and downward GMR bars (formed on downward slopes) differ from each other in inclinations (or inclined shapes). Compared with upward GMR bars, downward GMR bars are reduced in inclination; that is, downward GMR bars are reduced in thickness so that exposed areas thereof increase; hence, they are easily affected by oxidization.

SUMMARY OF THE INVENTION

It is an object of the present invention to provide a magnetic sensor having superior hysteresis characteristics.

It is another object of the present invention to provide a manufacturing method of the magnetic sensor.

In a first aspect of the present invention, a magnetic sensor is constituted of a substrate, a silicon oxide film that is formed on the substrate so as to form a planar surface and a slope, a plurality of magnetoresistive elements, each of which is formed by laminating a free layer, a conductive layer, and a pin layer on the substrate, a plurality of lead films that are formed to connect the magnetoresistive elements in series, a CVD oxide film for covering the magnetoresistive elements, and a non-magnetic film that is formed between the magnetoresistive elements and the CVD oxide film so as to cover the periphery of the free layer in connection with each magnetoresistive element. Herein, the magnetoresistive elements are individually formed on the planar surface and the slope of the substrate.

In a second aspect of the present invention, the magnetic sensor is manufactured by way of a mount surface forming step, a magnetoresistive element forming step, a CVD oxide film forming step, a non-magnetic film forming step, and a patterning step. The planar surface and the slope are formed using the silicon oxide film on the substrate in the mount surface forming step. In the magnetoresistive element forming step, each of the magnetoresistive elements is formed by laminating the free layer, conductive layer, and pin layer on the substrate. The lead films are formed to connect the magnetoresistive elements in series. In the CVD oxide film forming step, the CVD oxide film is formed to cover the magnetoresistive elements by way of chemical vapor deposition (CVD). In the non-magnetic film forming step, the non-magnetic film is formed and inserted between the magnetoresistive elements and the CVD oxide film. In the patterning step, the non-magnetic film is subjected to patterning, thus covering the periphery of the free layer in connection with each magnetoresistive element. Herein, the non-magnetic film is formed by way of sputtering.

In the above, the magnetization heat treatment is performed so as to magnetize the pin layers of the magnetoresistive elements.

The present invention offers a variety of effects as follows:
(1) Since the non-magnetic film is formed to cover the periphery of the free layer with respect to each magnetoresistive element prior to the CVD oxide film forming step, it is possible to protect the magnetoresistive elements by the non-magnetic film. This prevents the magnetoresistive elements from absorbing oxygen activated in the chemical vapor deposition, thus avoiding oxidization of the magnetoresistive elements.

(2) Since the magnetoresistive elements are formed on the planar surface and slope, it is possible to detect magnetism in two-axial directions and three-axial directions.
(3) It is possible to prevent the free layers of the magnetoresistive elements from being degraded in weak magnetic characteristics; hence, it is possible to precisely detect magnetism in two-axial directions and three-axial directions.
(4) Due to sputtering, it is possible to form the non-magnetic film by use of a chamber having inert gas without using oxygen. This prevents the magnetoresistive elements from absorbing oxygen during the formation of the CVD oxide film.
(5) Due to the formation of the non-magnetic film for covering the peripheries of the free layers of the magnetoresistive elements prior to the CVD oxide film forming step, it is possible to reliably protect the magnetoresistive elements with the non-magnetic film. This prevents the magnetoresistive elements from absorbing activated oxygen (due to the chemical vapor deposition) on the surfaces thereof and from being oxidized. Thus, it is possible to produce the magnetic sensor having the magnetoresistive elements having superior hysteresis characteristics.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENT

The present invention will be described in further detail by way of examples with reference to the accompanying drawings.

1. Magnetic Sensor

A three-axial magnetic sensor 10 according to a preferred embodiment of the present invention will be described with reference to FIGS. 1A, 1B, 2A, 2B, 3, 4A, 4B, 4C, 5, 6A, 6B, 7A, 7B, and 7C.

Figure 1A:
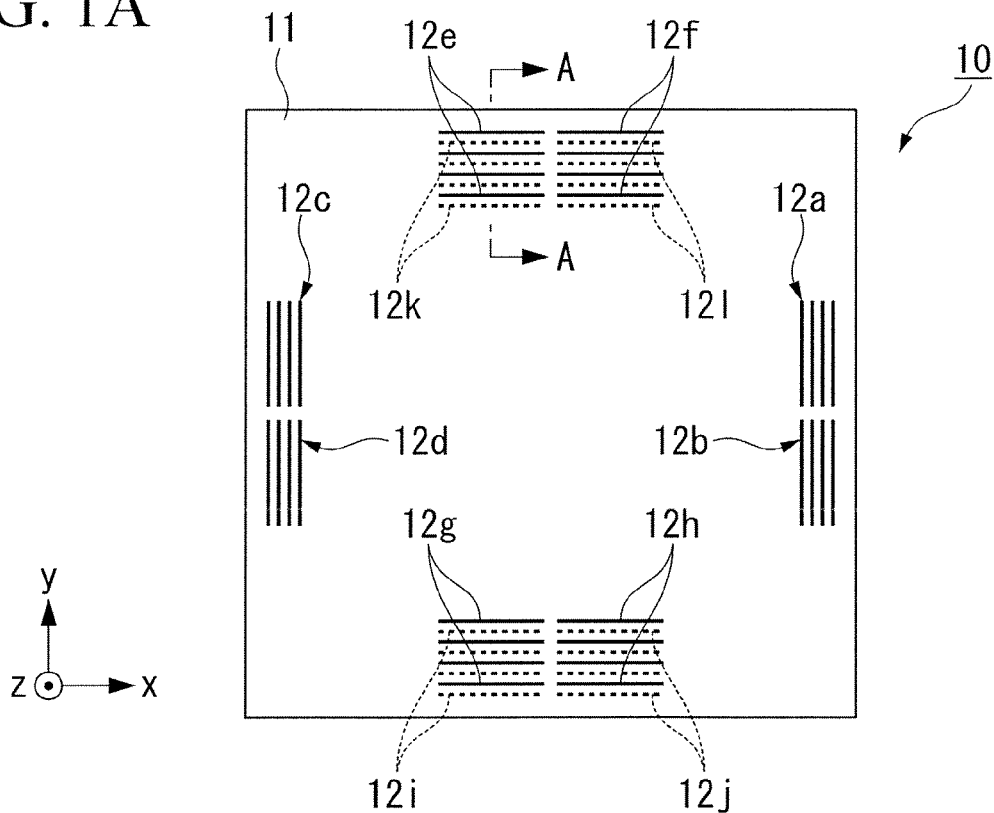
FIG. 1A is a plan view showing the constitution of a three-axial magnetic sensor including a plurality of GMR components in accordance with a preferred embodiment of the present invention.

As shown in FIG. 1A, the three-axial magnetic sensor 10 is produced using a substrate 11 having a square shape in play view (defined by an X-axis and a Y-axis perpendicularly crossing each other) and a prescribed thickness (defined by a Z-axis perpendicular to the X-axis and Y-axis), wherein the substrate 11 is composed of quartz and silicon. In total, twelve GMR components each composed of four GMR bars (denoted by line segments and dotted line segments in FIG. 1A) are formed on the substrate 11. Specifically, there are provided X-axis GMR component 12a to 12d (see line segments drawn along the Y-axis), Y1-axis GMR components 12e to 12h (see line segments drawn along the X-axis), and Y2-axis GMR components 12i to 12l (see dotted line segments drawn along the X-axis). In addition, pads, vias, and wires (all not shown) are also fabricated in the substrate 11. Pads are used to output signals from wires, and vias are formed to establish connections between giant magnetoresistive elements and wires and are not exposed in the final stage of manufacturing. Furthermore, LSI components and wiring layers are fabricated in the substrate 11. Substrates having LSI components are used for magnetic sensors producing digital output signals; and substrates having wiring layers are only used for magnetic sensors producing analog output signals.

In FIG. 1A, the left end of the square-shaped substrate 11 is set to a reference point in the X-axis, wherein the rightward direction from the reference point will be referred to as a positive X-axis direction; the leftward direction will be referred to as a negative X-axis direction; and the center area therebetween will be referred to as an X-axis center area. The lower end of the square-shaped substrate 11 is set to a reference point in the Y-axis, wherein the upward direction from the reference point will be referred to as a positive Y-axis direction; the downward direction will be referred to as a negative Y-axis direction; and the center area therebetween will be referred to as a Y-axis center area. In proximity to the right side of the substrate 11, the first X-axis GMR component 12a is arranged above the Y-axis center area, and the second X-axis GMR component 12b is arranged below the Y-axis center area. In proximity to the left side of the substrate 11, the third X-axis GMR component 12c is arranged above the Y-axis center area, and the fourth X-axis GMR component 12d is arranged below the Y-axis center area.

In proximity to the upper end of the substrate 11, the first Y1-axis GMR component 12e is arranged in the left of the X-axis center area, and the second Y1-axis GMR component 12f is arranged in the right of the X-axis center area. In proximity to the lower end of the substrate 11, the third Y1-axis GMR component 12g is arranged in the left of the X-axis center area, and the fourth Y1-axis GMR component 12h is arranged in the right of the X-axis center area.

In proximity to the lower end of the substrate 11, the first Y2-axis GMR component 12i is arranged in the left of the X-axis center area, and the second Y2-axis GMR component 12j is arranged in the right of the X-axis center area. In proximity to the upper end of the substrate 11, the third Y2-axis GMR component 12k is arranged in the left of the X-axis center area, and the fourth Y2-axis GMR component 12l is arranged in the right of the X-axis center area.

Figure 2A:
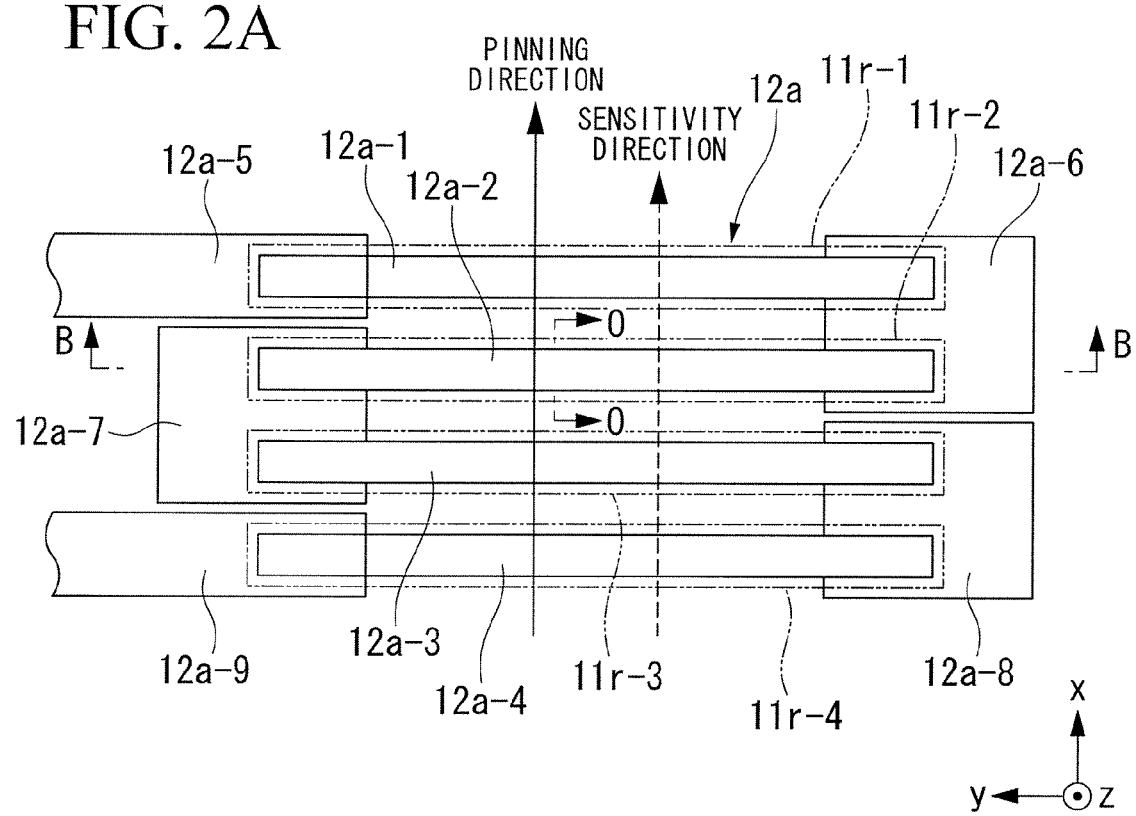
FIG. 2A is a plan view showing the constitution of a GMR component including four GMR bars that are connected in series via lead films.

Each of the GMR components 12a to 12l includes a plurality of band-shaped GMR bars (or magnetoresistive films), which adjoin together and which are connected in series via lead films forming terminals thereof, wherein it is preferable that each of the X-axis GMR components 12a to 12d be composed of an even number of GMR bars. FIG. 2A shows the constitution of the first X-axis GMR component 12a (which is similar to other GMR components 12b to 12l), in which four GMR bars 12a-1, 12a-2, 12a-3, and 12a-4 are connected in series via lead films 12a-6, 12a-7, and 12a-8 and in which lead films 12a-5 and 12a-9 are connected to both ends of the series connection of the GMR bars 12a-1 to 12a-4. The GMR bars 12a-1 to 12a-4 are formed on planar surfaces parallel to the overall surface of the substrate 11, wherein the longitudinal directions thereof lie in parallel to the Y-axis (perpendicular to the X-axis). The GMR bars 12a-1, 12a-2, 12a-3, and 12a-4 are covered with non-magnetic films 11r-1, 11r-2, 11r-3, and 11r-4.

The X-axis GMR components 12a to 12d are formed on planar surfaces lying perpendicular to the thickness direction of the substrate 11. Each of the X-axis GMR components 12a to 12d is formed on an upper oxide film (i.e. a silicon oxide film) 11i composed of $SiO_2$ on the substrate 11 as shown in FIG. 3.

Figure 3:
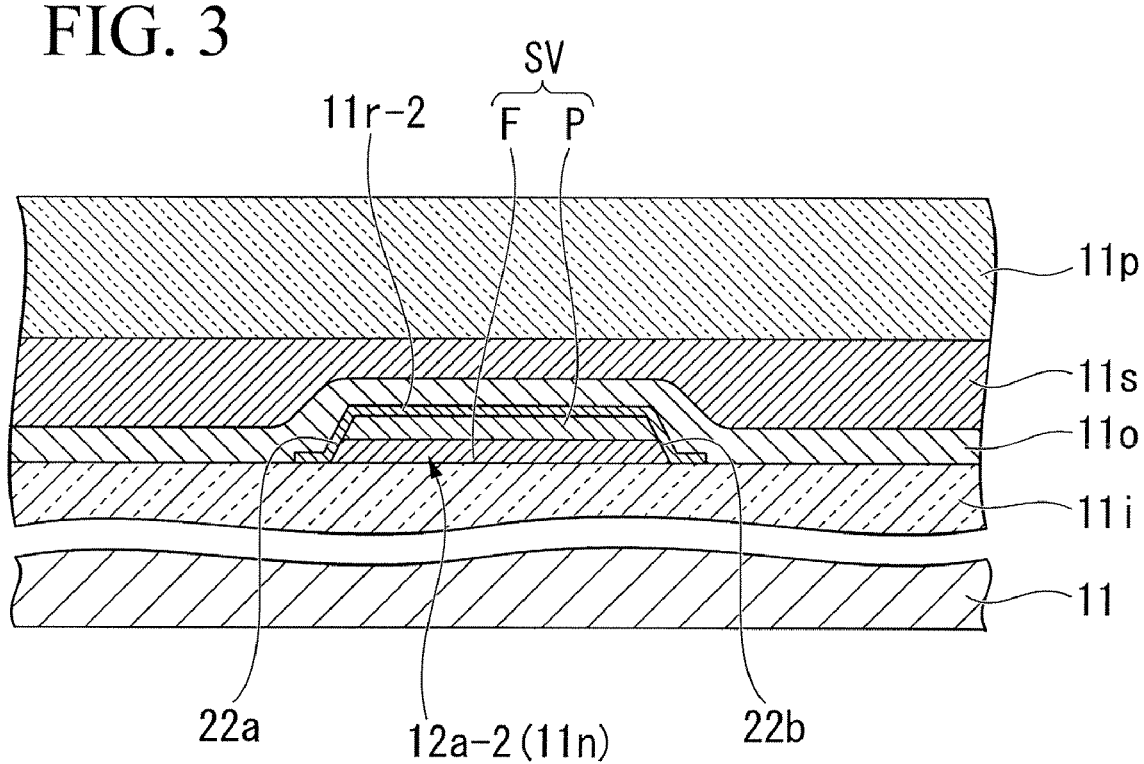
FIG. 3 is a cross-sectional view taken along line O-O in FIG. 2A.

In FIG. 3, side surfaces 22a and 22b, which lie along the longitudinal direction of the GMR bar 12a-2 forming the X-axis GMR component 12a, are inclined oppositely to the upper oxide film 11i and are each formed in a semi-tapered shape. Herein, a spin-valve film SV includes a free layer F and a pin layer P as well as a spacer layer S and a capping layer C (both of which are not illustrated in FIG. 3).

The non-magnetic layer 11r-2 composed of a non-magnetic substance is formed above the GMR bar 12a-2. In order to avoid oxidization of giant magnetoresistive elements, it is preferable to use a specific metal as the non-magnetic substance, by which the non-magnetic layer 11r-2 itself is oxidized but to avoid corrosion of giant magnetoresistive elements. For example, it is possible to list metals such as Ti, V, Cr, Nb, Mo, Hf, Ta, W, Re, and Zn. It is possible to use other metals on which passivation films or oxide films are formed on surfaces. It is preferable to use materials having high resistances in consideration of characteristics of magnetic sensors. In consideration of matching with semiconductor manufacturing processes, it is preferable to use non-magnetic metals such as tantalum (Ta), chromium (Cr), and titanium (Ti). These metals formed on the non-magnetic layer 11r-2 may have good adhesion with a CVD oxide film 11o and are preferable in terms of environmental factors.

As shown in FIG. 2A, each of the non-magnetic films covering the peripheral portions of the corresponding GMR bars is subjected to patterning such that the periphery thereof does not come in contact with other non-magnetic films adjoining thereto, other GMR bars, and other lead films other than the lead films connected to both ends of the corresponding GMR bars. For example, the non-magnetic film 11r-2 covering the peripheral portion of the GMR bar 12a-2 is formed in contact with the lead films 12a-6 and 12a-7, but it is subjected to patterning such that the periphery thereof does not come in contact with the other GMR bars 12a-1, 12a-3, and 12a-4, other lead films 12a-5, 12a-8, and 12a-9, and other non-magnetic films 11r-1, 11r-3, and 11r-4. This makes it possible to use non-magnetic metals having high resistance and conductivity. In addition, the peripheries of the non-magnetic film 11r-1 to 11r-4 cover the surface of the upper oxide film 11i. Thus, it is possible to prevent active oxygen of the upper oxide film 11i from being introduced into the GMR bars 12a-1 to 12a-4 via their peripheral portions.

It is preferable that the thickness of the non-magnetic film 11r-2 range from 50 Å to 100 Å. When the thickness is reduced to be less than 50 Å, the non-magnetic film 11r-2 cannot be formed to entirely cover the GMR bar 12a-2; this makes it difficult to prevent active oxygen from being introduced into the GMR bar 12a-2. When the thickness is increased to be higher than 100 Å, the non-magnetic film 11r-2 may negatively affect the characteristics of the GMR bar 12a-2; hence, it is not preferable to increase the thickness to be higher than 100 Å. In this connection, the term "non-magnetic"(or non-magnetism) indicates that non-magnetic films are not magnetized without an external magnetic field, and they hardly impart magnetic influences to GMR bars, thus serving as a magnetic sensor, wherein it indicates materials except for ferromagnetic materials and antiferromagnetic materials. That is, diamagnetic materials and paramagnetic materials may form non-magnetic materials.

As shown in FIG. 3, the CVD oxide film 11o is formed on the non-magnetic film 11r-2. The CVD oxide film 11o is composed of a $SiO_2$ film having 1500 Å thickness.

A nitride film 11s is formed on the CVD oxide film 11o. The nitride film 11s is composed of a hard material such as a $SiN_x$ (e.g. $Si_3N_4$) film having 5000 Å thickness. A polyimide film 11p composed of polyimide is formed on the nitride film 11s.

The non-magnetic film 11r-2, the CVD oxide film 11o, the nitride film 11s, and the polyimide film 11p form a protection film (or a passivation film) for the GMR bar 12a-2. Due to the protection film, it is possible to secure water resistance, heat resistance, and electric insulation with respect to the GMR bar 12a-2. The aforementioned description is given with respect to the GMR bar 12a-2, whereas the configuration of the GMR bar 12a-2 can be applied to other GMR bars 12a-1, 12a-3, and 12a-4 as well as other X-axis GMR components 12b to 12d, and the configuration of the protection film can be applied to their protection films; hence, the detailed description therefor will be omitted.

Figure 1B:
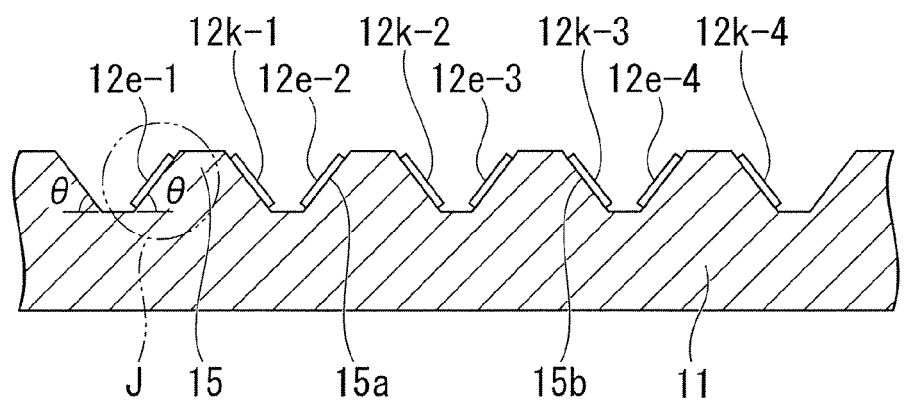
FIG. 1B is a cross-sectional view taken along line A-A in FIG. 1A.

The relationship between the Y1-axis GMR component 12e and the Y2-axis GMR component 12k will be described with reference to FIGS. 1B and 4B. They are formed using projections (or banks) 15 having trapezoidal cross-sectional shapes, which are formed using the upper oxide film 11i, wherein each projection 15 has a first slope 15a and a second slope 15b. Specifically, the GMR bars 12e-1 to 12e-4 of the Y-1 axis GMR component 12e are formed on the first slopes 15a of the projections 15, while the GMR bars 12k-1 to 12k-4 of the Y2-axis GMR component 12k are formed on the second slopes 15b of the projections 15. The GMR bars 12e-1 to 12e-4 and the GMR bars 12k-1 to 12k-4 are arranged such that the longitudinal directions thereof run in parallel with the ridge lines of the projections 15. Both the first slope 15a and the second slope 15b have the same inclination angle θ, which is set to a range of $20° \leq \theta \leq 60°$ relative to the planar surface of the substrate 11.

Figure 5:
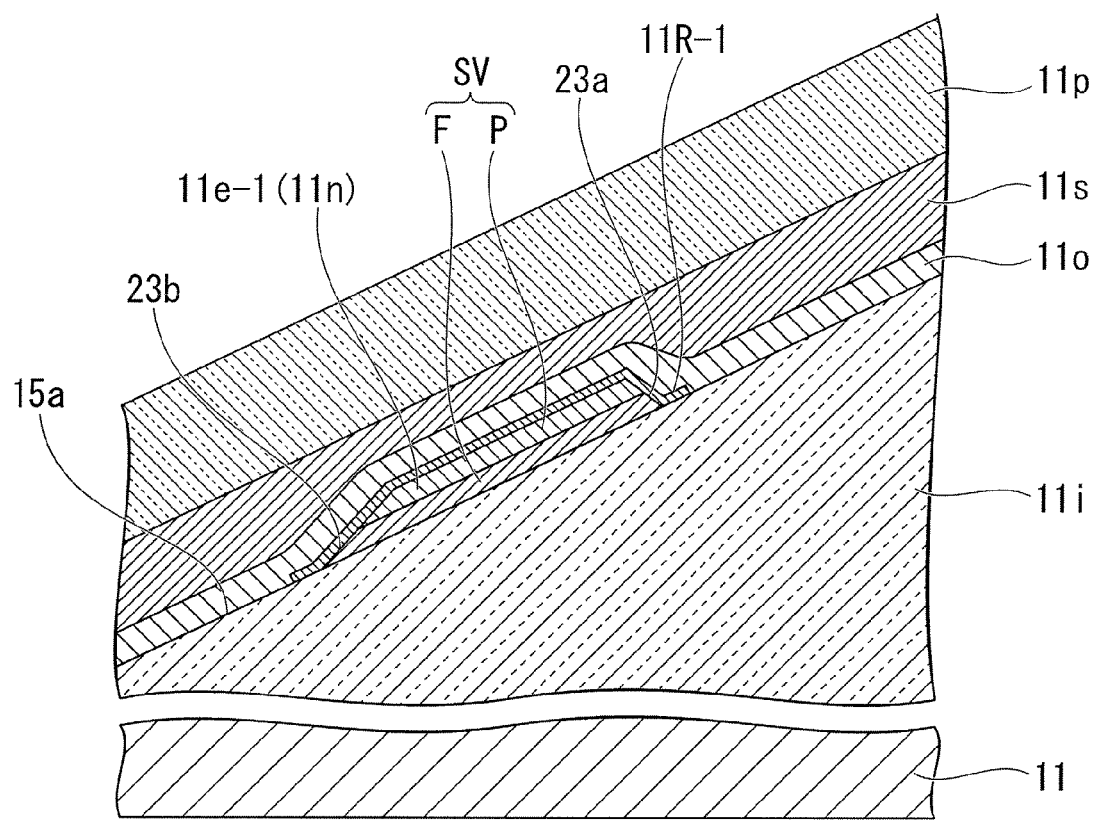
FIG. 5 is an enlarged cross-sectional view showing a section J shown in FIG. 1B.

In addition, each of the GMR bars 12e-1 to 12e-4 of the Y1-axis GMR component 12e is disposed opposite to each of the GMR bars 12k-1 to 12k-4 of the Y2-axis GMR component 12k with respect to each projection 15. Furthermore, the GMR bars of the Y1-axis GMR components 12e to 12h and the GMR bars of the Y2-axis GMR components 12i to 12l are arranged such that the longitudinal directions thereof lie in parallel with the X-axis (perpendicular to the Y-axis). Non-magnetic films are also formed to cover the GMR bars 12e-1 to 12e-4 of the Y1-axis GMR component 12e and the GMR bars 12k-1 to 12k-4 of the Y2-axis GMR component 12k. FIG. 5 shows a non-magnetic film 11R-1 formed on the GMR bar 12e-1, for example.

As shown in FIG. 5, the first slopes 15a for disposing the Y1-axis GMR components 12e to 12h and the second slopes 15b for disposing the Y2-axis GMR components 12i to 12l are each formed using the upper oxide film 11i composed of a $SiO_2$ film, which is formed on the planar surface of the substrate 11. Thus, the Y1-axis GMR components 12e to 12h and the Y2-axis GMR components 12i to 12l are formed on the upper oxide film 11i.

FIG. 5 shows the GMR bar 12a-1 formed on the first slope 15a, wherein its side surfaces 23a and 23b are inclined to the upper oxide film 11i so as to form a semi-tapered shape relative to the upper oxide film 11i. The lower side surface 23b, which is positioned in the lower area of the first slope 15a, has a small inclination and a large periphery in comparison with the upper side surface 23a, which is positioned in the upper area of the first slope 15a. In FIG. 5, the spin-valve film SV includes only the pin layer P and the free layer F but exclude the capping layer C and the spacer layer S.

The non-magnetic film 11R-1 (similar to the non-magnetic film 11r-2, see FIG. 3) is formed on the GMR bar 12e-1, wherein the CVD oxide film 11o, the nitride film 11s, and the polyimide film 11p (serving as a protection film) is formed on the non-magnetic film 11R-1. The aforementioned description is given with respect to the GMR bar 12e-1 of the Y1-axis GMR component 12e, whereas the configuration of the GMR bar 12e-1 can be applied to the other GMR bars of the Y1-axis GMR components 12e to 12h and the GMR bars of the Y2-axis GMR components 12i to 12l, and the configuration of the protection film can be applied to other projection films covering them; hence, the detailed description therefor will be omitted.

The configuration of the GMR bar 12a-2 of the X-axis GMR component 12a will be described with reference to FIGS. 2B and 6. The configuration of the GMR bars 12a-2 can be applied to other GMR bars 112a-1, 12a-3, and 12a-4; hence, the detailed description thereof will omitted. In addition, it can be applied to other GMR bars included in the other X-axis GMR components 12b to 12d, the Y1-axis GMR components 12e to 12h, and the Y2-axis GMR components 12i to 12l; hence, the detailed description thereof will be omitted.

Figure 2B:
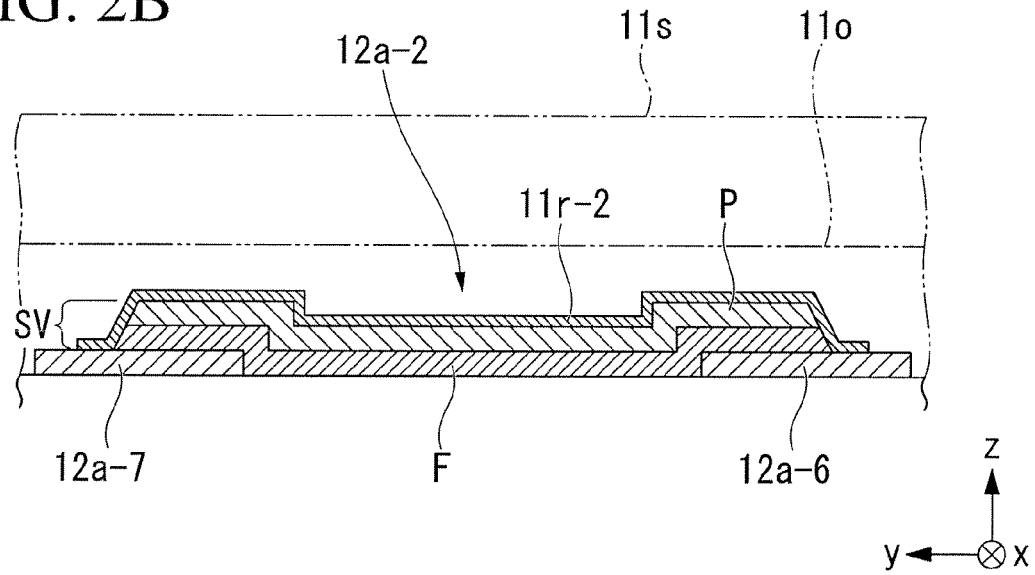
FIG. 2B is a cross-sectional view taken along line B-B in FIG. 2A.

As shown in FIG. 2B, the GMR bar 12a-2 of the X-axis GMR component 12a is formed using the spin-valve film SV whose longitudinal direction is perpendicular to the X-axis, in other words, whose longitudinal direction is parallel to the Y-axis. The spin-valve film SV is connected to the lead films 12a-6 and 12a-7, which is formed on both sides thereof and therebelow. The lead films 12a-6 and 12a-7 are each composed of a non-magnetic metal film (e.g. Cr), the thickness of which is set to 130 nm (or 1300 Å), for example.

Figure 6A:
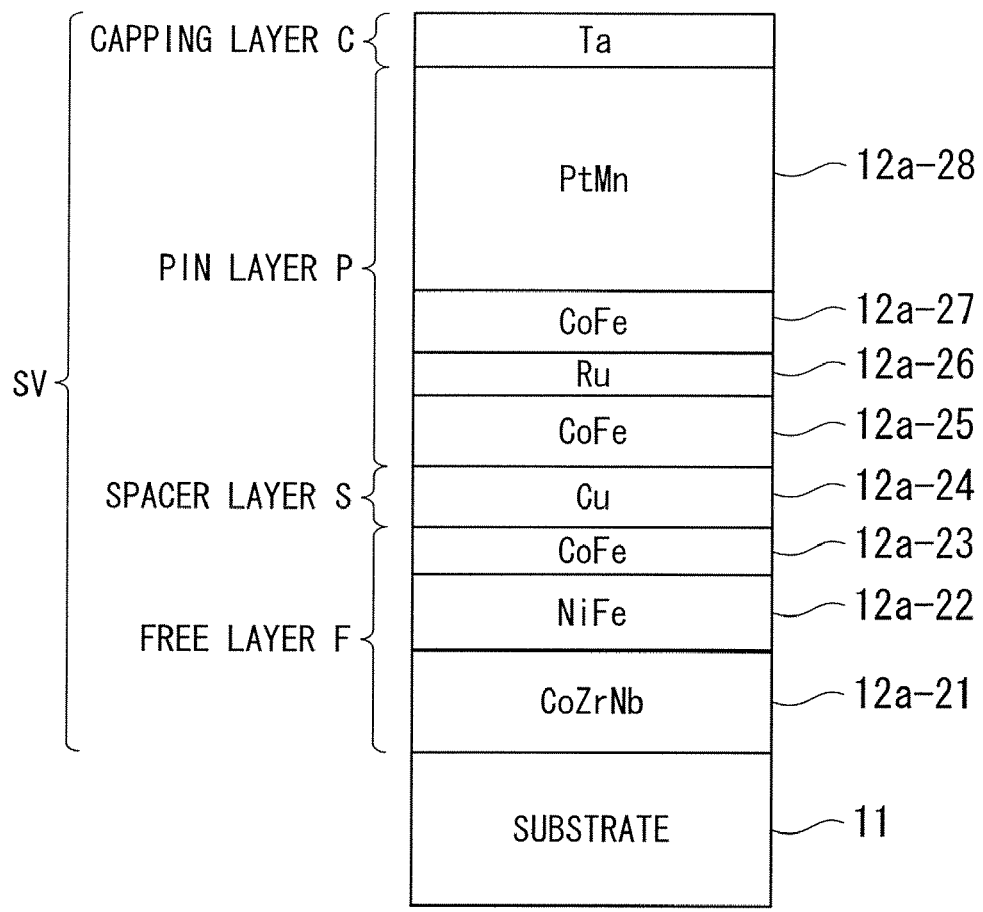
FIG. 6A diagrammatically shows the laminated structure of a giant magnetoresistive element for use in the three-axial magnetic sensor.

As shown in FIG. 6A, the spin-valve layer SV is formed by sequentially laminating a free layer (i.e. a free magnetic layer) F, a conductive spacer layer (i.e. a conductive layer) of a 2.8 nm (28 Å) thickness composed of Cu, a pin layer (i.e. a fixed layer or a fixed magnetic layer) P, and a capping layer C of a 2.5 nm (25 Å) thickness composed of tantalum (Ta) or titanium (Ti) on the substrate 11.

The free layer F is varied in the magnetization direction thereof based on the direction of an external magnetic field and is constituted of a CoZrNb amorphous magnetic layer 12a-21 of a 8 nm (80 Å) thickness (which is formed on the substrate 11), a NiFe magnetic layer 12a-22 of a 3.3 nm (33 Å) thickness (which is formed on the CoZrNb amorphous magnetic layer 12a-21), and a CoFe layer 12a-23 of a 1.2 nm (12 Å) thickness (which is formed on the NiFe magnetic layer 12a-22).

The CoZrNb amorphous magnetic layer 12a-21, the NiFe magnetic layer 12a-22, and the CoFe layer 12a-23 form a soft ferromagnetic thin film. The CoFe layer 12a-23 avoids the Ni diffusion of the NiFe layer 12a-22 and the Cu diffusion of a Cu layer 12a-24 forming the spacer layer S.

The pin layer P is constituted of a first CoFe magnetic layer 12a-25 of a 3.2 nm (32 Å) thickness (which is formed on the Cu layer 12a-24), a Ru layer 12a-26 of a 0.5 nm (5 Å) thickness (which is formed on the first CoFe magnetic layer 12a-25), a second CoFe magnetic layer 12a-27 of a 2.2 nm (22 Å) thickness (which is formed on the Ru layer 12a-26), and an antiferromagnetic layer of a 24 nm (240 Å) thickness composed of a PtMn alloy whose Pt content ranges from 45 mol % to 55 mol % (which is formed on the second CoFe magnetic layer 12a-27).

The aforementioned values regarding the thicknesses of various layers of the free layer F and the pin layer P, the thickness of the spacer layer S, and the thickness of the capping layer C are determined with respect to the X-axis GMR components 12a to 12d. Thicknesses of the aforementioned layers applied to the Y1-axis GMR components 12e to 12h and the Y2-axis GMR components 12i to 12l are reduced to 70% to 80% the thicknesses of the aforementioned layers applied to X-axis GMR components 12a to 12d. In FIG. 2B, the spin valve layer includes only the free layer F and the pin layer P but excludes the spacer layer S and the capping layer C.

Figure 6B:
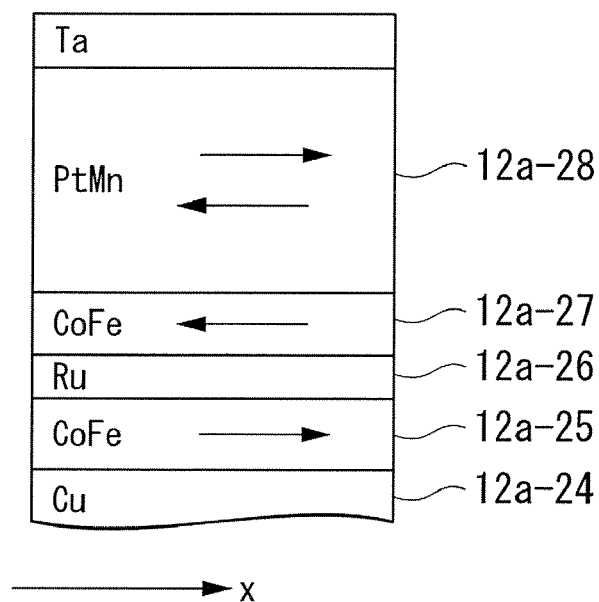
FIG. 6B diagrammatically shows magnetization directions of layers included in a pin layer shown in FIG. 6A.

As shown in FIG. 6B, the second CoFe magnetic layer 12a-27 is lined with the antiferromagnetic layer 12a-28 in a switched connection manner, wherein the magnetization direction (or magnetic vector) thereof is fixed (or pinned) in the negative X-axis direction. The first CoFe magnetic layer 12a-25 is connected with the second CeFe magnetic layer 12a-27 in an antiferromagnetic manner, wherein the magnetization direction thereof is fixed (or pinned) in the positive X-axis direction. That is, the overall magnetization direction of the pin layer P is determined by the first CoFe magnetic layer 12a-25 and the second CoFe magnetic layer 12a-27.

Figure 4A:
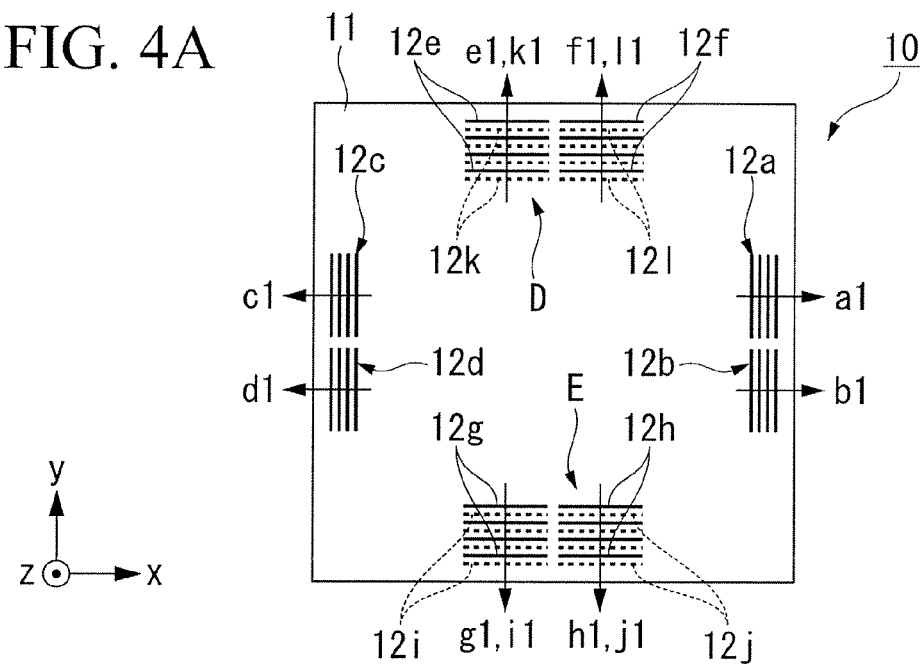
FIG. 4A is a plan view showing the constitution of the three-axial magnetic sensor in connection with pinning directions and sensitivity directions.

As shown in FIGS. 2A, 4A, and 6B, the sensitivity direction (for sensing a magnetic field) of the first X-axis GMR component 12a is parallel to the planar surface of the substrate 11 and perpendicular to the magnetization direction of the free layer F; that is, it is perpendicular to the longitudinal directions of the GMR bars, and it lies in the positive X-axis direction (denoted by "a1" in FIG. 4A). Similar to the first X-axis GMR component, the sensitivity direction of the second X-axis GMR component 12b lies in the positive X-axis direction (denoted by "b1" in FIG. 4A).

Therefore, when a magnetic field is applied to the three-axial magnetic sensor 10 in the directions a1 and b1, the resistances of the first and second X-axis GMR components 12a and 12b decrease in proportion to the intensity of the magnetic field. When a magnetic field is applied in a direction opposite to the directions a1 and b1, the resistances of the first and second GMR components 12a and 12b increase in proportion to the intensity of the magnetic field.

As shown in FIG. 4A, the sensitivity directions of the third and fourth GMR components 12c and 12d are perpendicular to the longitudinal directions of the GMR bars; that is, they are 180° opposite to the sensitivity directions of the first and second GMR components 12a and 12b. That is, the magnetization directions (or magnetic vectors) of the third and fourth X-axis GMR components 12c and 12d lie in the negative X-axis direction (denoted by "c1" and "d1" in FIG. 4A; hence, the magnetization directions of the pin layers P of the third and fourth X-axis GMR components 12c and 12d are pinned 180° opposite to the magnetization directions of the pin layers P of the first and second GMR components 12a and 12b.

Therefore, when a magnetic field is applied to the three-axial magnetic sensor 10 in the directions c1 and d1, the resistances of the third and fourth GMR components 12c and 12d decrease in proportion to the intensity of the magnetic field. When a magnetic field is applied in a direction opposite to the directions c1 and d1, the resistances of the third and fourth GMR components 12c and 12d increase in proportion to the intensity of the magnetic field.

Figure 4B:
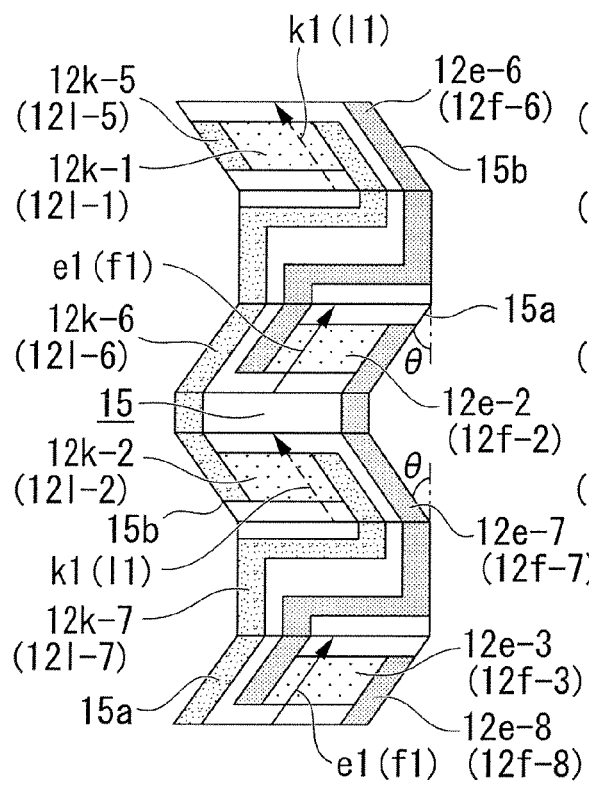
FIG. 4B is an enlarged perspective view showing a section D shown in FIG. 4A.

As shown in FIG. 4B, the sensitivity directions of the Y1-axis GMR components 12e and 12f (denoted by e1 and f1, see FIG. 4A) are perpendicular to the longitudinal directions of the GMR bars 12e-1 to 12e-4 and 12f-1 to 12f-4 and lie in the negative Z-axis direction and the positive Y-axis direction along the first slopes 15a (having the inclination angle θ) of the projections 15.

Therefore, when a magnetic field is applied to the three-axial magnetic sensor 10 in the directions e1 and f1, the resistances of the Y1-axis GMR components 12e and 12f decrease in proportion to the intensity of the magnetic field. When a magnetic field is applied in a direction opposite to the directions e1 and f1, the resistances of the Y1-axis GMR components 12e and 12f increase in response to the intensity of the magnetic field.

Figure 4C:
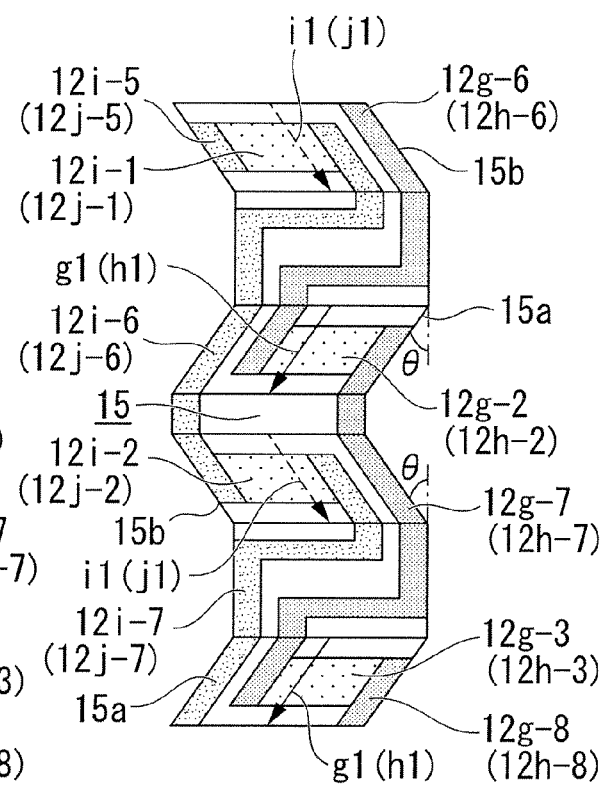
FIG. 4C is an enlarged perspective view showing a section E shown in FIG. 4A.

As shown in FIG. 4C, the sensitivity directions (denoted by g1 and h1, see FIG. 4A) of the Y1-axis GMR components 12g and 12h are perpendicular to the longitudinal directions of the GMR bars 12g-1 to 12g-4 and 12h-1 to 12h-4 and lie in the negative Z-axis direction and the negative Y-axis direction along the first slopes 15a of the projections 15. That is, the sensitivity directions of the Y1-axis GMR components 12g and 12h are 180° opposite to the sensitivity directions of the Y1-axis GMR components 12e and 12f.

Therefore, when a magnetic field is applied to the three-axial magnetic sensor 10 in the directions g1 and h1, the resistances of the Y1-axis GMR components 12g and 12h decrease in response to the intensity of the magnetic field. When a magnetic field is applied in a direction opposite to the directions g1 and h1, the resistances of the Y1-axis GMR components 12g and 12h increase in response to the intensity of the magnetic field.

As shown in FIG. 4C, the sensitivity directions (denoted by i1 and j1) of the Y2-axis GMR components 12i and 12j are perpendicular to the longitudinal directions of the GMR components 12i-1 to 12i-4 and 12j-1 to 12j-4 and lie in the positive Z-axis direction and the negative Y-axis directions along the second slopes (having the inclination angle θ) of the projections 15.

Therefore, when a magnetic field is applied to the three-axial magnetic sensor 10 in the directions i1 and j1, the resistances of the Y2-axis GMR components 12i and 12j decrease in proportion to the intensity of the magnetic field. When a magnetic field is applied in a direction opposite to the directions i1 and j1, the resistances of the Y2-axis GMR components 12i and 12j increase in proportion to the intensity of the magnetic field.

As shown in FIG. 4B, the sensitivity directions (denoted by k1 and l1) of the Y2-axis GMR components 12k and 12l are perpendicular to the longitudinal directions of the GMR bars 12k-1 to 12k-4 and 12l-1 to 12l-4 and lie in the positive Z-axis direction and the positive Y-axis direction along the second slopes 15b of the projections 15. That is, the sensitivity directions of the Y2-axis GMR components 12k and 12l are 180° opposite to the sensitivity directions of the Y2-axis GMR components 12i and 12j.

Therefore, when a magnetic field is applied to the three-axial magnetic sensor 10 in the directions k1 and l1, the resistances of the Y2-axis GMR components 12k and 12l decrease in proportion to the intensity of the magnetic field. When a magnetic field is applied in a direction opposite to the directions k1 and l1, the resistances of the Y2-axis GMR components 12k and 12l increase in proportion to the intensity of the magnetic field.

Next, the operation of the three-axial magnetic sensor 10 will be described with reference to FIGS. 7A to 7C, which show three equivalent circuits including three sets of four GMR components connected in a bridge form using pads. Herein, arrows show the magnetization directions of the GMR components 12a to 12l, wherein upward arrows show the magnetization directions in which the pin layers P of the corresponding GMR components are pinned in the negative Y-axis direction.

Figure 7A:
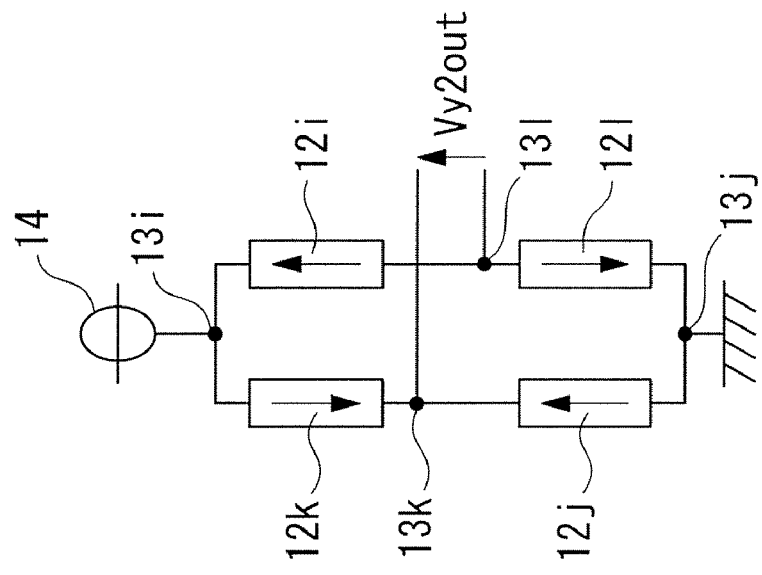
FIG. 7A shows an equivalent circuit of a bridge connection of four X-axis GMR components included in the three-axial magnetic sensor.

FIG. 7A shows an equivalent circuit of the X-axis GMR components 12a to 12d (having the sensitivity directions a1 to d1) connected in a bridge form using pads 13a to 13d. The pads 13a and 13b are connected to positive and negative polarities of a constant voltage source 14 and are applied with potentials $Vxin^+$ (e.g. 3V) and $Vxin^-$ (e.g. 0V), whereby the pads 13c and 13d produce potentials $Vxout^+$ and $Vxout^-$. Thus, the equivalent circuit of FIG. 7A produces a sensor output Vxout corresponding to a potential difference of ($Vxout^+ - Vxout^-$).

Figure 7B:
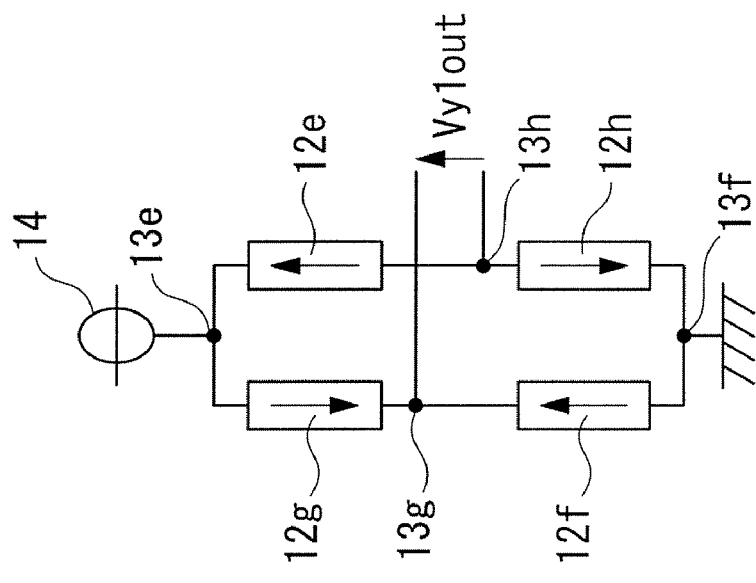
FIG. 7B shows an equivalent circuit of a bridge connection of four Y1-axis GMR components included in the three-axial magnetic sensor.

FIG. 7B shows an equivalent circuit of the Y1-axis GMR components 12e to 12h (having the sensitivity directions e1 to h1) connected in a bridge form using pads 13e to 13h. The pads 13e and 13f are connected to the positive and negative polarities of the constant voltage source 14 and are applied with potentials $Vy1in^+$ (e.g. 3V) and $Vy1in^-$ (e.g. 0V), whereby the pads 13g and 13h produce potentials $Vy1out^+$ and $Vy1out^-$. Thus, the equivalent circuit of FIG. 7B produces a sensor output Vy1out corresponding to a potential difference of ($Vy1out^+ - Vy1out^-$).

Figure 7C:
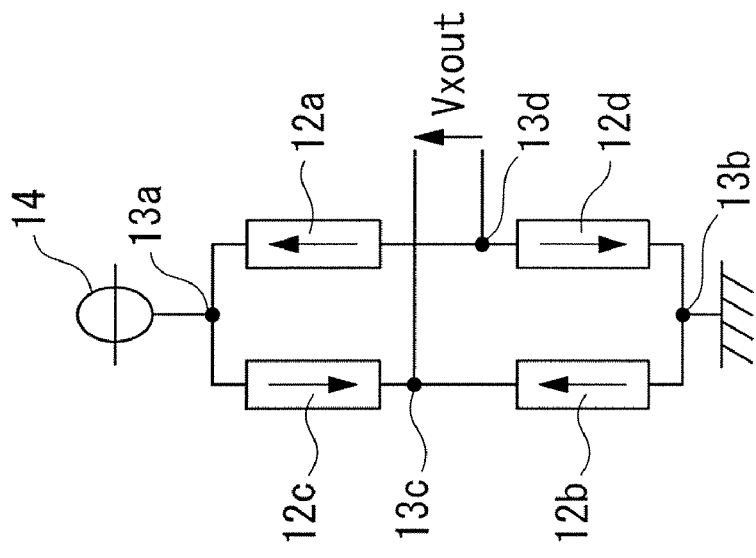
FIG. 7C shows an equivalent circuit of a bridge connection of four Y2-axis GMR components included in the three-axial magnetic sensor.

FIG. 7C shows an equivalent circuit of the Y2-axis GMR components 12i to 12l (having the sensitivity directions i1 to l1) connected in a bridge form using pads 13i to 13l. The pads 13i and 13j are connected to the positive and negative polarities of the constant voltage source 14 and are applied with potentials $Vy2in^+$ (e.g. 3V) and $Vy2in^-$ (e.g. 0V), whereby the pads 13k and 13l produce potentials $Vy2out^+$ and $Vy2out^-$. Thus, the equivalent circuit of FIG. 7C produces a sensor output Vy2out corresponding to a potential difference of ($Vy2out^+ - Vy2out^-$).

A magnetic field applied to the three-axial magnetic sensor 10 includes an X-axis component Hx, a Y-axis component Hy, and a Z-axis component Hz, which are calculated in accordance with equations (1), (2), and (3) based on the sensor outputs Vxout, Vy1out, and Vy2out. Calculations are performed by the LSI circuitry fabricated in the substrate 11 in advance or by an LSI chip individually connected to the three-axial magnetic sensor 10.

$$Hx = 2kx \times Vxout \qquad (1)$$

$$Hy = \frac{ky(Vy1out - Vy2out)}{\cos\theta} \qquad (2)$$

$$Hz = \frac{ky(Vy1out + Vy2out)}{\sin\theta} \qquad (3)$$

In the equations (1) to (3), θ denotes the inclination angle of the slopes 15a and 15b of the projection 15, where 20°≦θ≦60°. In addition, kx, ky, and kz denote constants, where kx=ky=kz if all the sensor outputs Vxout, Vy1out, and Vy2out are produced with the same sensitivity.

2. Manufacturing Method

Next, a manufacturing method of the three-axial magnetic sensor 10 will be described with reference to FIGS. 8A-8C, 9A-9C, 10A-10C, 11A-11C, 12A-12C, 13A-13C, 14A-14C, 15A-15C, 16A-16C, 17A-17C, 18A-18C, 19A-19C, and 20A-20C, wherein each drawing having suffix "A" shows a via, each drawing having suffix "B" shows a pad, and each drawing having suffix "C" shows Y1-axis and Y2-axis GMR components. In this connection, it is preferable that the substrate 11 be produced to incorporate the wiring layers in advance or to incorporate the LSI circuitry by way of CMOS processes in advance.

Figures 8A, 8B, 8C:
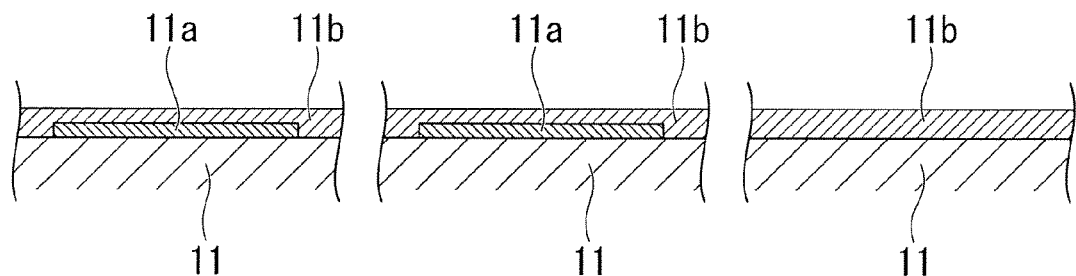
FIG. 8A is a cross-sectional view explaining a first step of a manufacturing method of the three-axial magnetic sensor in connection with a via.
FIG. 8B is a cross-sectional view explaining the first step of the manufacturing method of the three-axial magnetic sensor in connection with a pad.
FIG. 8C is a cross-sectional view explaining the first step of the manufacturing method of the three-axial magnetic sensor in connection with Y1-axis and Y2-axis GMR components.

In a first step of the manufacturing method of the three-axial magnetic sensor 10, as shown in FIGS. 8A to 8C, an interlayer insulating film (composed of Spin On Glass, i.e. SOG) 11b is applied onto a wiring layer 11a formed on the substrate 11.

Figures 9A, 9B, 9C:
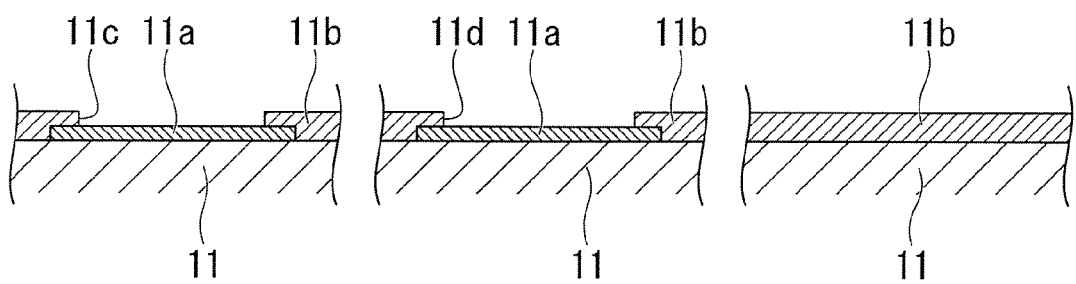
FIG. 9A is a cross-sectional view explaining a second step of the manufacturing method of the three-axial magnetic sensor in connection with the via.
FIG. 9B is a cross-sectional view explaining the second step of the manufacturing method of the three-axial magnetic sensor in connection with the pad.
FIG. 9C is a cross-sectional view explaining the second step of the manufacturing method of the three-axial magnetic sensor in connection with the Y1-axis and Y2-axis GMR components.

In a second step of the manufacturing method, as shown in FIGS. 9A to 9C, a part of the interlayer insulating film 11b is removed by way of etching with respect to the via and pad, thus forming openings 11c and 11d exposing the wiring layer 11a.

Figures 10A, 10B, 10C:
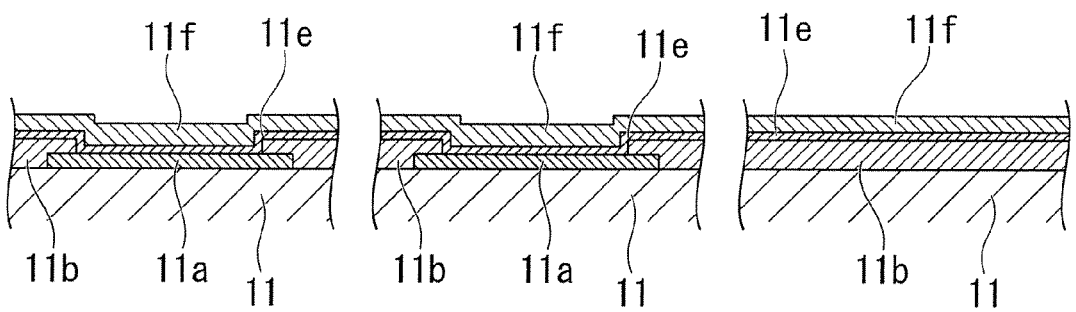
FIG. 10A is a cross-sectional view explaining a third step of the manufacturing method of the three-axial magnetic sensor in connection with the via.
FIG. 10B is a cross-sectional view explaining the third step of the manufacturing method of the three-axial magnetic sensor in connection with the pad.
FIG. 10C is a cross-sectional view explaining the third step of the manufacturing method of the three-axial magnetic sensor in connection with the Y1-axis and Y2-axis GMR components.

In a third step of the manufacturing method, as shown in FIGS. 10A to 10C, an oxide film 11e (composed of $SiO_x$, e.g. $SiO_2$) having a 1500 Å thickness and a nitride film 11f (composed of $SiN_x$, e.g. $Si_3N_4$) having a 5000 Å thickness are formed above the surface of the substrate 11 by way of plasma CVD. A resist is applied thereto, then the substrate 11 is subjected to cutting in a prescribed pattern forming openings with respect to the via and the pad.

Figure 11A:
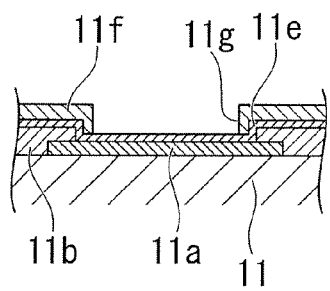
FIG. 11A is a cross-sectional view explaining a fourth step of the manufacturing method of the three-axial magnetic sensor in connection with the via.
Figure 11B:
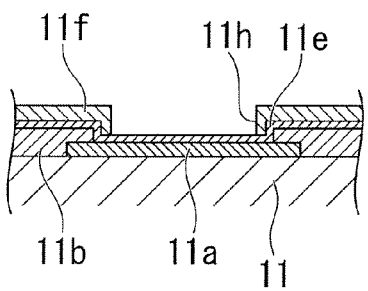
FIG. 11B is a cross-sectional view explaining the fourth step of the manufacturing method of the three-axial magnetic sensor in connection with the pad.
Figure 11C:
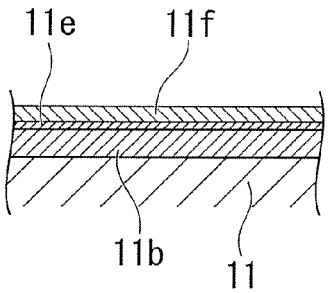
FIG. 11C is a cross-sectional view explaining the fourth step of the manufacturing method of the three-axial magnetic sensor in connection with the Y1-axis and Y2-axis GMR components.

In a fourth step of the manufacturing method, as shown in FIGS. 11A to 11C, a part of the nitride film 11f above the via and the pad is removed by etching, and then the resist is removed, thus forming openings 11g and 11h exposing the oxide film 11e in the nitride film 11f with respect to the via and the pad. During the formation of the openings 11g and 11h, the oxide film 11e is not completely etched so as to leave a prescribed part thereof, wherein the widths (or diameters) of the openings 11g and 11h become smaller than the widths (or diameters) of the openings 11c and 11d. This prevents the interlayer insulating film 11b from being exposed via the openings 11c and 11d, thus preventing water from entering into the wiring layer and the LSI circuitry of the substrate 11.

Figure 12A:
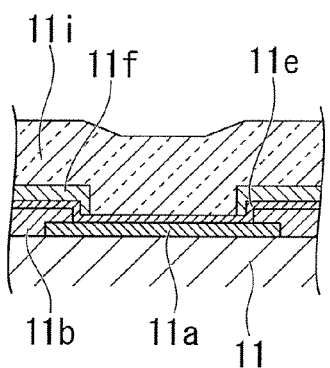
FIG. 12A is a cross-sectional view explaining a fifth step of the manufacturing method of the three-axial magnetic sensor in connection with the via.
Figure 12B:
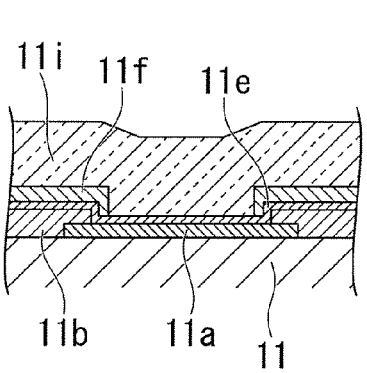
FIG. 12B is a cross-sectional view explaining the fifth step of the manufacturing method of the three-axial magnetic sensor in connection with the pad.
Figure 12C:
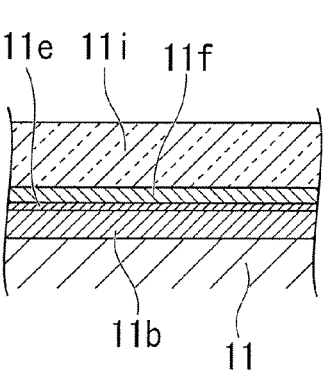
FIG. 12C is a cross-sectional view explaining the fifth step of the manufacturing method of the three-axial magnetic sensor in connection with the Y1-axis and Y2-axis GMR components.

In a fifth step of the manufacturing method, as shown in FIGS. 12A to 12C, an upper oxide film 11i (composed of $SiO_x$, e.g. SiO2) having a 5 μm thickness is formed on the oxide film 11e and the nitride film 11f by way of plasma CVD. Next, a resist is applied onto the upper oxide film 11i so as to form a resist film 11j (see FIGS. 13A to 13C) having a 5 μm thickness is formed on the upper oxide film 11i. This is called a mount surface forming step.

Figure 13A:
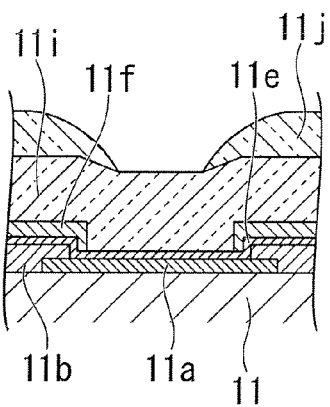
FIG. 13A is a cross-sectional view explaining a sixth step of the manufacturing method of the three-axial magnetic sensor in connection with the via.
Figure 13B:
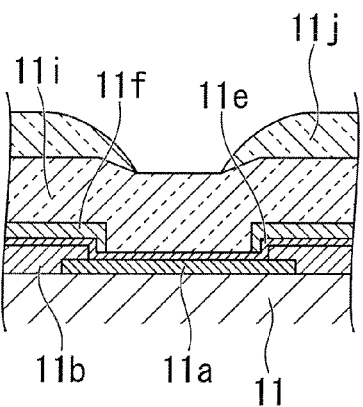
FIG. 13B is a cross-sectional view explaining the sixth step of the manufacturing method of the three-axial magnetic sensor in connection with the pad.
Figure 13C:
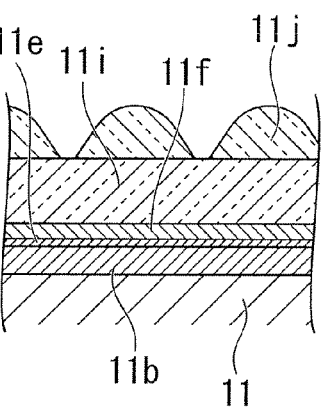
FIG. 13C is a cross-sectional view explaining the sixth step of the manufacturing method of the three-axial magnetic sensor in connection with the Y1-axis and Y2-axis GMR components.

In a sixth step of the manufacturing method, as shown in FIGS. 13A to 13C, the resist film 11j is subjected to cutting in a prescribed pattern forming openings with respect to both the via and the pad, and is also subjected to cutting in a prescribed pattern forming the projections 15 for forming Y1-axis GMR components and Y2-axis GMR components. After the completion of cutting, the substrate 11 is subjected to heat treatment for one to ten minutes at 150° C. Thus, as shown in FIGS. 13A to 13C, corners of the resist film 11j are each formed in a tapered shape.

Figure 14A:
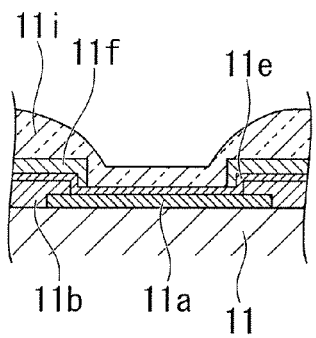
FIG. 14A is a cross-sectional view explaining a seventh step of the manufacturing method of the three-axial magnetic sensor in connection with the via.
Figure 14B:
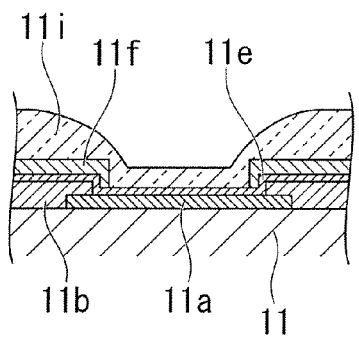
FIG. 14B is a cross-sectional view explaining the seventh step of the manufacturing method of the three-axial magnetic sensor in connection with the pad.
Figure 14C:
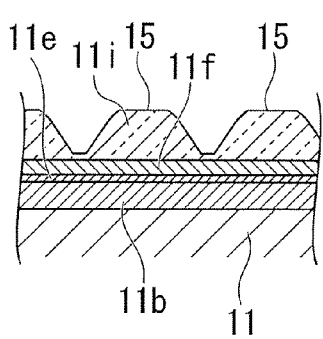
FIG. 14C is a cross-sectional view explaining the seventh step of the manufacturing method of the three-axial magnetic sensor in connection with the Y1-axis and Y2-axis GMR components.

In a seventh step of the manufacturing method, as shown in FIGS. 14A to 14C, dry etching is performed with the same etching rate applied to the upper oxide film 11i and the resist film 11j such that the remained thickness (after etching) of the upper oxide film 11i is maximally set to approximately 0.5 μm (or 5000 Å). In this connection, the width (or diameter) of the opening of the upper oxide film 11i does not become larger than the width (or diameter) of the opening of the nitride film 11f with respect to the via and the pad.

After completion of the dry etching, the remained resist film 11j is completely removed so as to form the projections 15 composed of the upper oxide film 11i with respect to GMR components as shown in FIG. 14C.

Figure 15A:
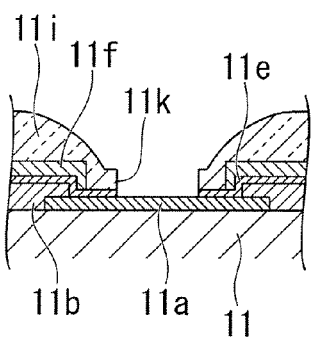
FIG. 15A is a cross-sectional view explaining an eighth step of the manufacturing method of the three-axial magnetic sensor in connection with the via.
Figure 15B:
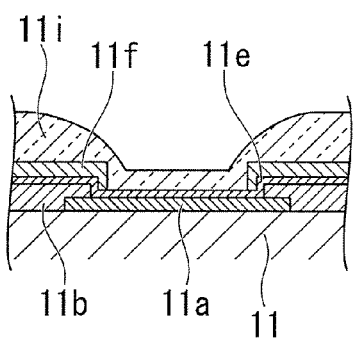
FIG. 15B is a cross-sectional view explaining the eighth step of the manufacturing method of the three-axial magnetic sensor in connection with the pad.
Figure 15C:
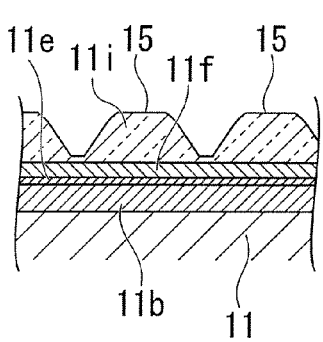
FIG. 15C is a cross-sectional view explaining the eighth step of the manufacturing method of the three-axial magnetic sensor in connection with the Y1-axis and Y2-axis GMR components.

In an eighth step of the manufacturing method, as shown in FIGS. 15A to 15C, a resist is applied onto the upper oxide film 11i and is then subjected to cutting in a prescribed pattern forming an opening with respect to the via; thereafter, it is subjected to etching. Then, the resist (which still remains irrespective of etching) is completely removed so as to form an opening 11k in the via, thus exposing the wiring layer 11a (i.e. the uppermost layer of the substrate 11) as shown in FIG. 15A. As shown in FIG. 15B, etching may be performed such that the oxide film 11e and the upper oxide film 11i still remain above the wiring layer 11a in connection with to the pad. Alternatively, the pad can be reformed similar to the via shown in FIG. 15A such that the oxide film 11e and the upper oxide film 11i are simultaneously removed so as to expose the wiring layer 11a in connection with the pad.

Figure 16A:
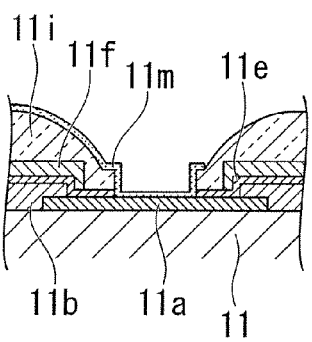
FIG. 16A is a cross-sectional view explaining a ninth step of the manufacturing method of the three-axial magnetic sensor in connection with the via.
Figure 16B:
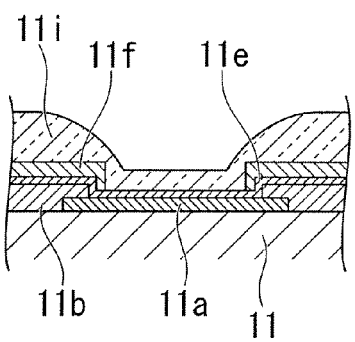
FIG. 16B is a cross-sectional view explaining the ninth step of the manufacturing method of the three-axial magnetic sensor in connection with the pad.
Figure 16C:
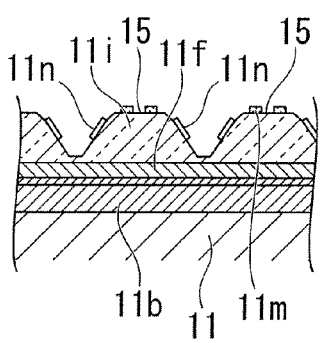
FIG. 16C is a cross-sectional view explaining the ninth step of the manufacturing method of the three-axial magnetic sensor in connection with the Y1-axis and Y2-axis GMR components.

In a ninth step of the manufacturing method, as shown in FIGS. 16A to 16C, a lead film 11m (forming the forgoing lead films 12a-5 to 12a-9 shown in FIG. 2A) composed of Cr is formed on the upper oxide film 11i and a part of the wiring layer 11a (which is exposed in the via) by way of physical vapor deposition (PVD) such as sputtering, vacuum evaporation, and ion plating. A resist is applied onto the upper oxide film 11i and the lead film 11m and is then subjected to cutting in a prescribed pattern of the lead film 11m; thereafter, the lead film 11m is subjected to etching.

In this connection, etching is appropriately performed on the slopes 15a and 15b of the projections 15, and then heat treatment is performed to reshape the cross-sectional shape of the projections 15 by way of heat treatment, thus forming the resist in a tapered shape. After completion of the etching, the resist still remaining on the upper oxide film 11i is completely removed.

By way of sputtering, GMR multilayered films 11n (forming the foregoing GMR components 12a to 12l) are formed on the surfaces of the upper oxide film 11i and the lead film 11m. This is called a magnetoresistive element forming step.

In the magnetoresistive element forming step, as shown in FIG. 6A, the free layer F, the conductive spacer layer S having a 2.8 nm (i.e. 28 Å) thickness composed of Cu, the pin layer P, and the capping layer C having a 2.5 nm (i.e. 25 Å) thickness composed of tantalum (Ta) or titanium (Ti) are sequentially formed on the substrate 11, thus forming the GMR multilayered films 11n.

The free layer F is formed by sequentially forming the CoZrNb amorphous magnetic layer 12a-21 having a 8 nm (i.e. 80 Å) thickness, the NiFe magnetic layer 12a-22 having a 3.3 nm (i.e. 33 Å) thickness, and the CoFe film 12a-23 having a 1.2 nm (i.e. 12 Å) thickness on the substrate 11.

The pin layer P is formed by sequentially forming the first CoFe magnetic layer 12a-25 having a 3.2 nm (i.e. 32 Å) thickness, the Ru layer 12a-26 having a 0.5 nm (i.e. 5 Å) thickness, the second CoFe magnetic layer 12a-27 having a 2.2 nm (i.e. 22 Å) thickness, and the antiferromagnetic layer 12a-28 having a 24 nm (i.e. 240 Å) thickness composed of a PtMn alloy including Pt whose content ranges from 45 mol % to 55 mol % on the spacer layer S.

A permanent magnet array 16 (see FIG. 22) is positioned close to the substrate 11 having the GMR multilayered films 11n so as to perform magnetization heat treatment (i.e. pinning), thus fixing the magnetization direction of the pin layer P. This is called a magnetization heat treatment step.

A resist is applied onto the surfaces of the GMR multilayered films 11n with an appropriate thickness, e.g. 2 μm thickness on the planar surface of the substrate 11; then, a mask is applied to the surface of the resist, which is then subjected to burning and development so as to remove unnecessary resist, thus forming a resist film whose pattern matches the GMR multilayered films 11n. At this time, etching is appropriately performed so as to reshape the cross-sectional shapes of the projections 15 in a tapered shape. Then, a prescribed portion of the GMR multilayered films 11n not protected by the resist film is removed by way of ion milling, thus forming the GMR multilayered films 11n in prescribed shapes (e.g. thin bandlike shapes shown in FIG. 2A). Due to ion milling, the GMR multilayered films 11n are isolated from each other so as to form exposed surfaces of the GMR multilayered films 11n (forming the foregoing GMR bars), e.g. the side surfaces 22a and 22b shown in FIG. 3, and the side surfaces 23a and 23b shown in FIG. 5. The ion milling is performed such that both the GMR multilayered films 11n and the lead film 11m still remain in connection with the via, thus preventing a prescribed part of the lead film 11m positioned at the edge of the via from being broken.

Next, the resist film is removed so as to form a protection film covering the oxide film 11e, the upper oxide film 11i, the lead film 11m, and the GMR multilayered films 11n, which are exposed.

Figure 17A:
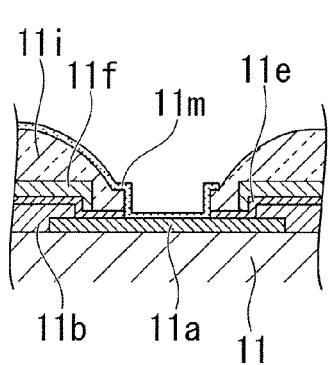
FIG. 17A is a cross-sectional view explaining a tenth step of the manufacturing method of the three-axial magnetic sensor in connection with the via.
Figure 17B:
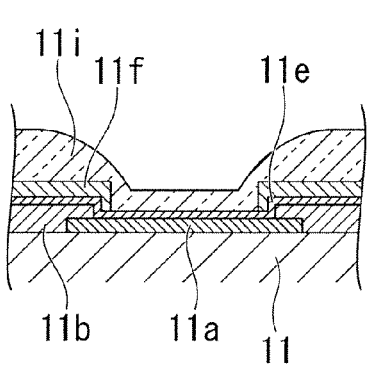
FIG. 17B is a cross-sectional view explaining the tenth step of the manufacturing method of the three-axial magnetic sensor in connection with the pad.
Figure 17C:
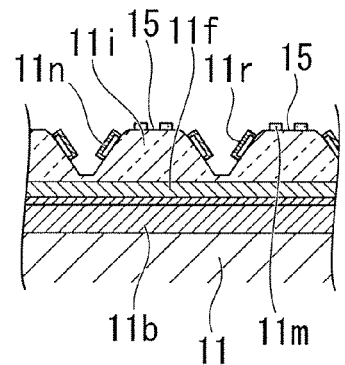
FIG. 17C is a cross-sectional view explaining the tenth step of the manufacturing method of the three-axial magnetic sensor in connection with the Y1-axis and Y2-axis GMR components.

In a tenth step of the manufacturing method, as shown in FIGS. 17A to 17C, non-magnetic films 11r (forming the foregoing non-magnetic films 11r-1 to 11r-4 and 11R-1) composed of non-magnetic metals such as tantalum (Ta) are formed on the surfaces of the GMR multilayered films 11n. This is called a non-magnetic film forming step. Specifically, they are formed in a chamber filled with inert gas (composed of nitride, argon, etc.) by way of sputtering such that their thickness ranges from 50 Å to 100 Å. Then, etching is performed so that the non-magnetic films 11r individually cover the GMR multilayered films 11n. This is called a patterning step.

Materials of various layers (e.g. free layers F in particular) of the GMR multilayered films 11n may be easily oxidized. However, the manufacturing method of the present embodiment is designed such that the chamber is not filled with oxygen but is filled with inert gas so as to form the non-magnetic films 11r by way of sputtering; hence, it is possible to prevent the surfaces of the GMR multilayered films 11n from absorbing oxygen and to individually cover the GMR multilayered films 11n with the non-magnetic films 11r. In this connection, it is possible to form the non-magnetic films 11r by way of various methods of PVD other than vacuum evaporation, laser abrasion, and sputtering.

Figure 18A:
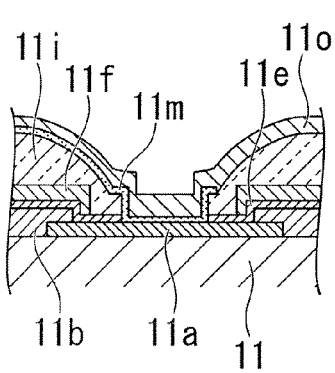
FIG. 18A is a cross-sectional view explaining an eleventh step of the manufacturing method of the three-axial magnetic sensor in connection with the via.
Figure 18B:
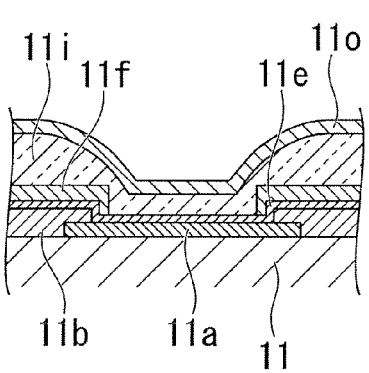
FIG. 18B is a cross-sectional view explaining the eleventh step of the manufacturing method of the three-axial magnetic sensor in connection with the pad.
Figure 18C:
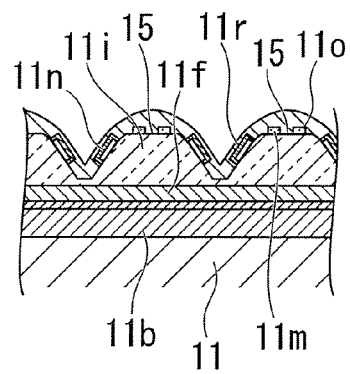
FIG. 18C is a cross-sectional view explaining the eleventh step of the manufacturing method of the three-axial magnetic sensor in connection with the Y1-axis and Y2-axis GMR components.

In an eleventh step of the manufacturing method, as shown in FIGS. 18A to 18C, the CVD oxide film 11o having a 1500 Å thickness (composed of $SiO_x$, e.g. $SiO_2$) is formed to cover the non-magnetic films 11r by way of plasma CVD. Specifically, the substrate 11 is placed in a chamber and is heated at 250° C.; then, the chamber is filled with reactive gas so as to activate materials by adding plasma energy, thus accelerating gas reaction.

Figure 19A:
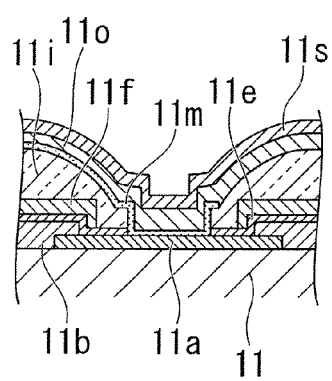
FIG. 19A is a cross-sectional view explaining a twelfth step of the manufacturing method of the three-axial magnetic sensor in connection with the via.
Figure 19B:
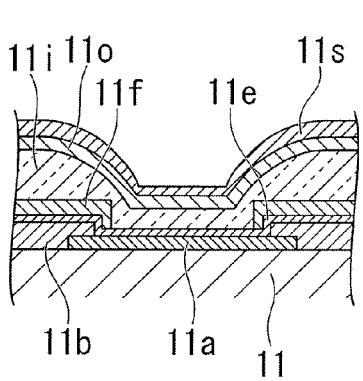
FIG. 19B is a cross-sectional view explaining the twelfth step of the manufacturing method of the three-axial magnetic sensor in connection with the pad.
Figure 19C:
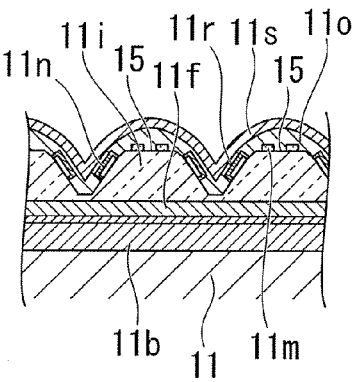
FIG. 19C is a cross-sectional view explaining the twelfth step of the manufacturing method of the three-axial magnetic sensor in connection with the Y1-axis and Y2-axis GMR components.

In a twelfth step of the manufacturing method, as shown in FIGS. 19A to 19C, a nitride film 11s having a 5000 Å thickness (composed of $SiN_x$, e.g. $Si_3N_4$) is formed on the CVD oxide film 11o by way of plasma CVD. Specifically, similar to the formation of the CVD oxide film 11o, the substrate 11 is placed in the chamber and is heated at 250° C.; then, the chamber is filled with reactive gas, and materials are activated by adding plasma energy, thus accelerating gas reaction.

Figure 20A:
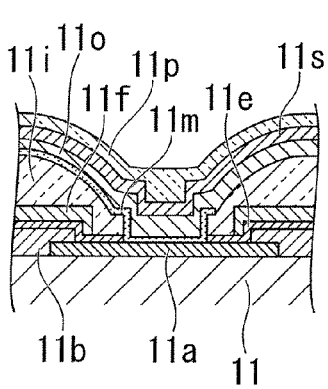
FIG. 20A is a cross-sectional view explaining a thirteenth step of the manufacturing method of the three-axial magnetic sensor in connection with the via.
Figure 20B:
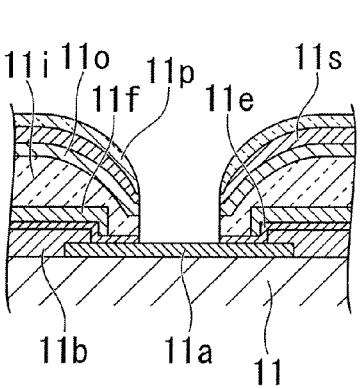
FIG. 20B is a cross-sectional view explaining the thirteenth step of the manufacturing method of the three-axial magnetic sensor in connection with the pad.
Figure 20C:
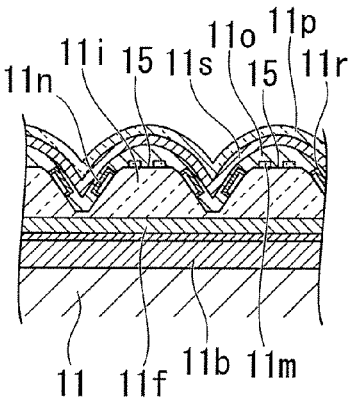
FIG. 20C is a cross-sectional view explaining the thirteenth step of the manufacturing method of the three-axial magnetic sensor in connection with the Y1-axis and Y2-axis GMR components.

In a thirteenth step of the manufacturing method, as shown in FIGS. 20A to 20C, a polyimide film 11p is formed on the nitride film 11s. Thus, the non-magnetic films 11r, the CVD) oxide film 11o, the nitride film 11, and the polyimide film 11p are sequentially formed so as to form a protection film covering the GMR multilayered films 11n.

A prescribed portion of the polyimide film 11p is masked with respect to the pad; then, the oxide film 11e, the CVD oxide film 11o, and the nitride film 11s on the wiring layer 11a are removed by way of etching with respect to the pad, which is thus exposed. Thus, an electrode pad corresponding to the exposed portion of the wiring layer 11a is formed in the substrate 11, which is then subjected to cutting. This completes the manufacturing of the three-axial magnetic sensor 10 shown in FIG. 1A.

The formation of the protection film and the electrode pad is not necessarily achieved by way of the aforementioned procedures. For example, the present embodiment can be modified such that, after completion of the formation of the CVD oxide film 11o and the nitride film 11s, the CVD oxide film 11o and the nitride film 11s are partially removed by way of etching with respect to the pad, so that the wiring layer 11a is partially exposed with respect to the pad. Next, the polyimide film 11p is formed on the CVD oxide film 11o, the nitride film 11s, and the wiring layer 11a so as to form the protection film. Lastly, the polyimide film 11p is partially removed by way of etching so as to partially expose the wiring layer 11a again with respect to the pad; thus, the exposed portion of the wiring layer 11a serves as an electrode pad.

Figure 21:
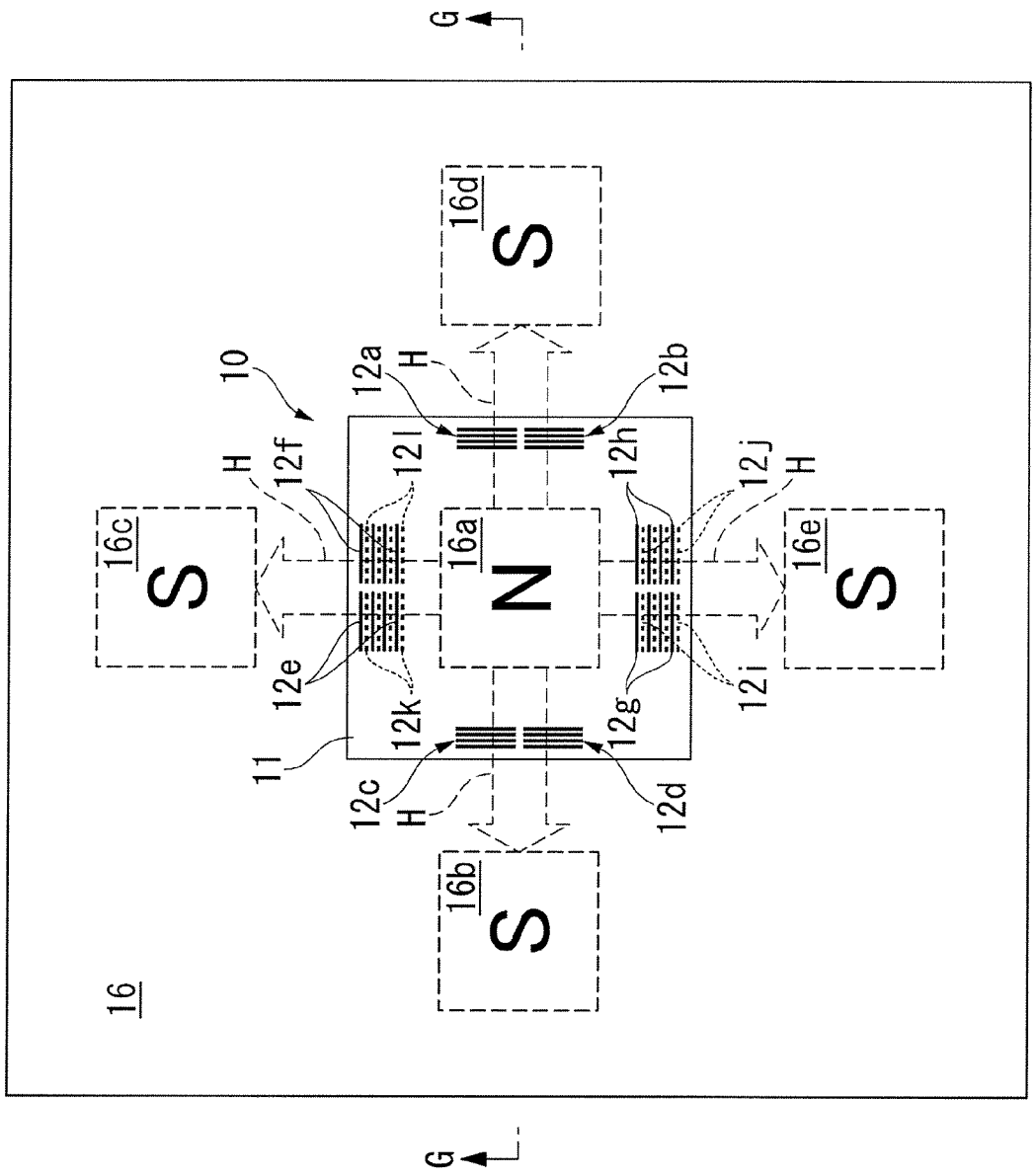
FIG. 21 is a plan view showing a magnet array having five permanent bar magnets.
Figure 22:
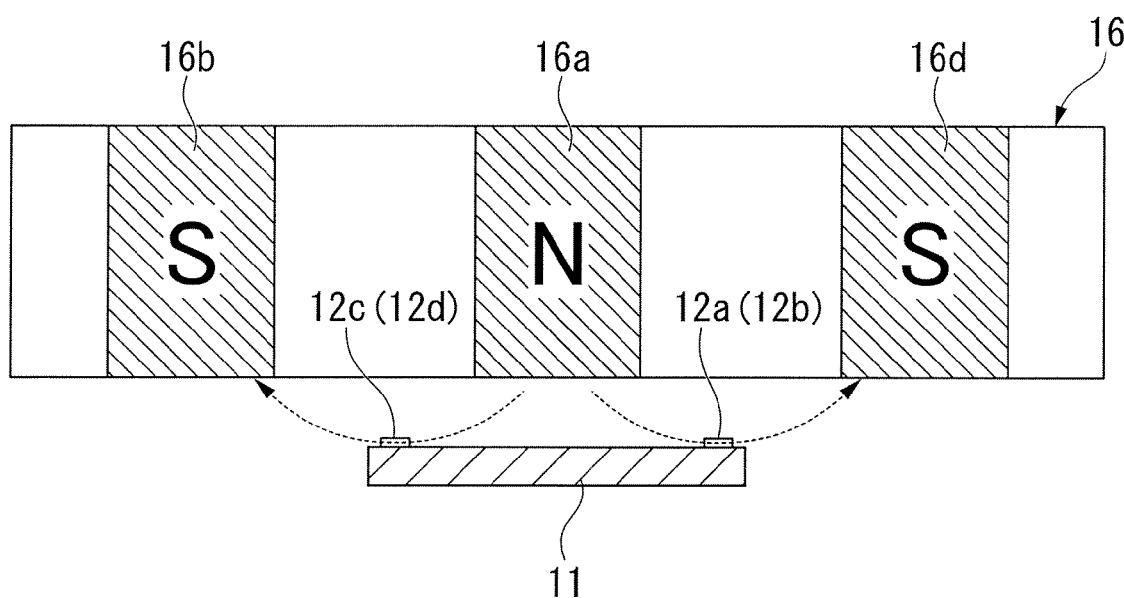
FIG. 22 is a cross-sectional view taken along line G-G in FIG. 21.

Next, the magnetization heat treatment (or pinning) will be described with reference to FIGS. 21 and 22, wherein FIG. 21 shows a magnet array 16 having five permanent bar magnets 16a to 16e. The magnet array 16 is arranged close to the backside of the substrate 11 (which is opposite to the surface forming the GMR multilayered films 11n). Then, the substrate 11 and the magnet array 16 are heated at a prescribed temperature ranging from 260° C. to 290° C. in a vacuum condition and are left for four hours.

In the above, the magnet array 16 includes five permanent bar magnets 16a to 16e, which are arranged in a lattice manner with different polarities. In the magnet array 16, the permanent bar magnet 16a whose lower end is magnetized in S pole is positioned close to the approximately center of the substrate 11, while the permanent bar magnets 16b to 16d (whose lower ends are magnetized in N pole) are positioned in the peripheral area of the substrate 11.

Due to the aforementioned positioning, a magnetic field H (see dotted arrows in FIG. 21) is formed such that magnetic lines crossing with a right angle of 90° are directed from the permanent bar magnet 16a (having N pole) to the permanent bar magnets 16b to 16e (each having S pole). Thus, the magnetic field H is formed such that the magnetic force thereof reaches the foregoing GMR components (e.g. the X-axis GMR components 12a to 12d shown in FIG. 21) due to the N pole of the permanent bar magnet 16a.

Using the magnetic field H, the substrate 11 and the magnet array 16 are heated at a prescribed temperature ranging from 260° C. to 290° C. in the vacuum condition and are left for four hours; thus, as shown in FIG. 6B, the magnetization direction of the second CoFe magnetic layer 12a-27 lying opposite the magnetic field H is lined and fixed in a switched connection manner with the magnetization direction of the antiferromagnetic film 28. Due to an antiferromagnetic connection with the second CoFe magnetic layer 12a-27, the first CoFe magnetic layer 12a-25 is fixed to match the magnetization direction of the magnetic field H.

In this connection, the magnetization direction of the first CoFe magnetic layer 12a-25 can be fixed to match the magnetization direction of the magnetic field H in the magnetization heat treatment.

As a result, the magnetization directions of the pin layers P included in the X-axis GMR components 12a and 12b are each fixed in the positive X-axis direction, i.e. the directions a1 and b1 shown in FIG. 4A, while the magnetization directions of the pin layers P included in the X-axis GMR components 12c and 12d are each fixed in the negative X-axis direction, i.e. the directions c1 and d2 shown in FIG. 4A.

The magnetization directions of the pin layers P included in the Y1-axis GMR components 12e and 12f are each fixed in the positive Y-axis direction along the first slopes 15a of the projections 15, i.e., the directions e1 and f1 shown in FIG. 4A, while the magnetization directions of the pin layers P included in the Y1-axis GMR components 12g and 12h are each fixed in the negative Y-axis direction along the first slopes 15a of the projections 15, i.e. the directions g1 and h1 shown in FIG. 4A.

The magnetization directions of the pin layers P included in the Y2-axis GMR components 12i and 12j are each fixed in the negative Y-axis direction along the second slopes 15b of the projections 15, i.e. the directions i1 and j1 shown in FIG. 4A, while the magnetization directions of the pin layers P included in the Y2-axis GMR components 12k and 12l are each fixed in the positive Y-axis direction along the second slopes 15b of the projections 15, i.e. the directions k1 and l1 shown in FIG. 4A.

Experiments have been performed so as to compare the present embodiment, in which non-magnetic films are formed to cover GMR components between GMR components and CVD oxide films and the conventional technology, in which CVD oxide films are directly formed on GMR components, with respect to hysteresis characteristics of X-axis GMR components, Y1-axis GMR components, and Y2-axis GMR components. Herein, experiments are performed by sputtering forming non-magnetic films, wherein a chamber is filled with inert gas such as argon (Ar) and tantalum (Ta) is used as a target.

Figure 23:
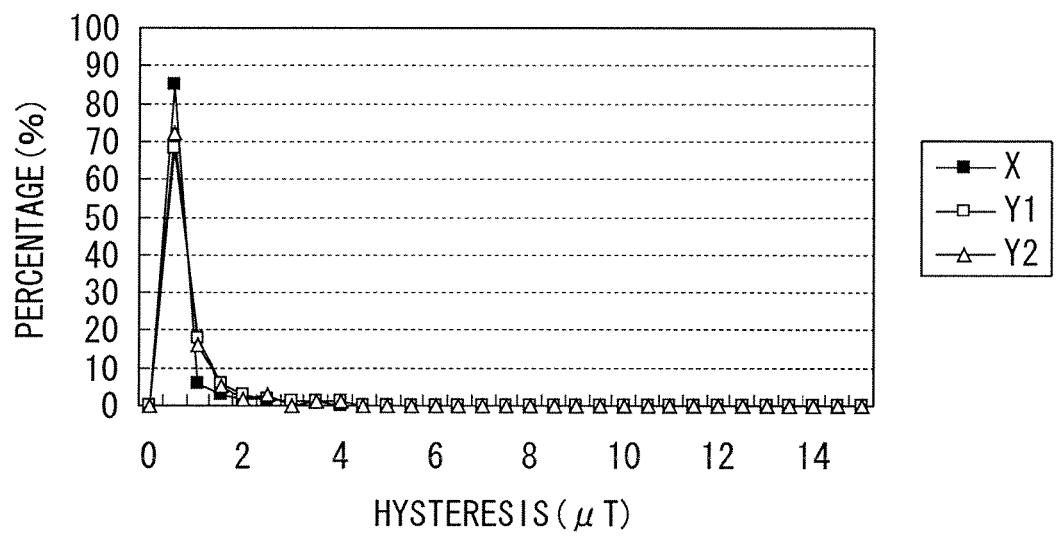
FIG. 23 is a graph showing a percentage of GMR components in relation to hysteresis in accordance with the present invention.
Figure 24:
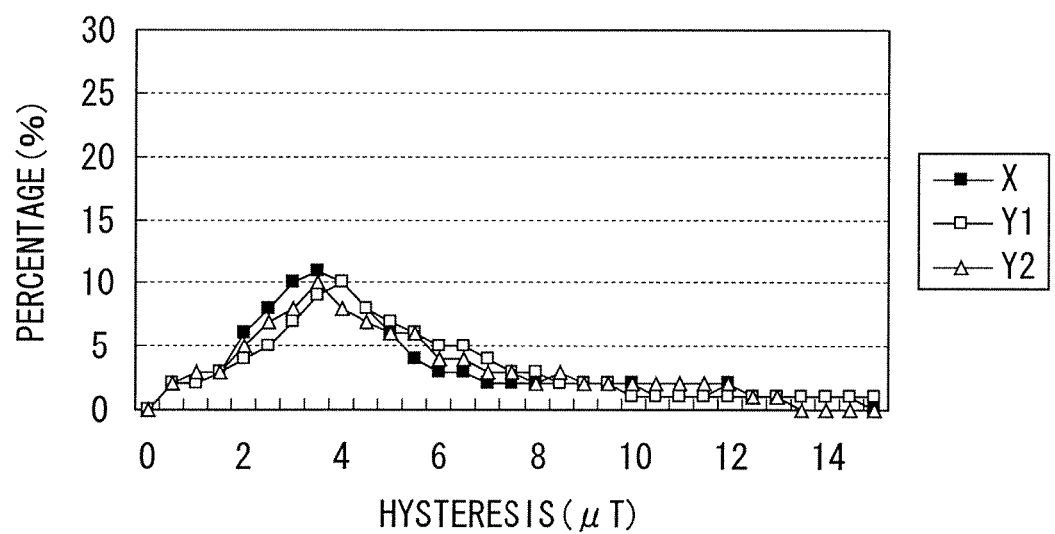
FIG. 24 is a graph showing a percentage of GMR components in relation to hysteresis in accordance with the conventionally-know technology.

FIGS. 23 and 24 show hysteresis characteristics of GMR components, wherein the horizontal axis represents hysteresis ($\mu$T), and the vertical axis represents percentage (%), i.e. the number of tested samples within one-hundred samples regarding GMR components. Herein, the hysteresis represents a difference of intensity between positive and negative polarities in a hysteresis curve when the output becomes zero while varying the intensity of an external magnetic field.

FIG. 24 shows the conventionally-known distribution of hysteresis in which the percentage of samples may range between 10% and 11% substantially in connection with values of hysteresis ranging between 3.5 $\mu$T and 4.0 $\mu$T with respect to X-axis GMR component, Y1-axis GMR components, and Y2-axis GMR components. This distribution embraces dispersions, which may range between 0.5 $\mu$T and 13 $\mu$T.

In the conventionally-known technology, CVD oxide films are directly formed on GMR components; hence, during the formation of CVD oxide films, GMR component may absorb oxygen activated by plasma in a chamber and thus oxidized, thus increasing hysteresis and causing dispersions of hysteresis.

FIG. 23 shows a distribution of hysteresis according to the present embodiment, in which the percentage regarding the number of GMR components is concentrated between 70% and 85% with respect to a hysteresis value of 0.5 $\mu$T. In addition, a peak range of hysteresis may range between 0.5 $\mu$T and 4.0 $\mu$T; hence, the present embodiment may produce relatively small dispersions in comparison with the conventionally-known technology.

Since the present embodiment is designed such that non-magnetic films covering GMR components are formed in connection with CVD oxide films, it is possible to prevent GMR components from absorbing oxygen, which may be activated in the chamber due to the formation of non-magnetic films.

As described above, the three-axial magnetic sensor 10 is designed such that, during the formation of protection films protecting GMR components, non-magnet films covering GMR components are formed by way of sputtering prior to the formation of CVD oxide films, whereby GMR bars can be coated with protection films within a chamber filled with inert gas.

Then, CVD oxide films are formed on non-magnetic films by way of plasma CVD, wherein it is possible to protect GMR components by non-magnetic films irrespective of the formation of CVD oxide films in the atmosphere in which oxygen is activated by plasma. Therefore, it is possible to prevent free layers F in particular within GMR bars from being oxidized due to the absorption of activated oxygen on the surfaces of GMR components. Thus, it is possible to avoid degradation of weak magnetic characteristics of free layers F; hence, it is possible to produce the three-axial magnetic sensor 10 having superior hysteresis characteristics.

In particular, the side surfaces 23b of GMR bars, which are formed along the longitudinal directions the first slopes 15a (or the second slopes 15b) of the projections 15, may be broadened in comparison with the side surfaces 23a; hence, they may easily absorb oxygen. To cope with such a drawback, the present embodiment is designed to reliably protect GMR bars from oxidization.

Since the three-axial magnetic sensor 10, in which GMR components are formed on the slopes 15a and 15b of the projection 15 as well as the planar surfaces of the substrate 11, is designed to detect different axial components of magnetism crossing each other, it is possible to detect magnetism in two-axial and three-axial directions.

The present embodiment is designed to perform patterning in which GMR bars are covered with non-magnetic films, whereas patterning can be achieved to protect only the peripheral portions of free layers F by means of non-magnetic films. This prevents weak magnetic characteristics from being degraded due to oxidation of free layers F, thus improving characteristics of the three-axial magnetic sensor 10.

The present embodiment is designed such that Y1-axis GMR components and Y2-axis GMR components are formed on the slope 15a and 15b of the projections 15; but this is not a restriction. The present invention simply requires such that they are formed on slopes that are inclined in different directions; hence, they can be each formed on different projections.

The present embodiment is directed to the three-axial magnetic sensor 10 in which GMR components are formed on the planar surfaces as well as the slopes 15a and 15b, which are inclined differently with respect to the projections 15; but this is not a restriction; hence, it can be applied to any types of magnetic sensors for detecting magnetism in one-axial direction and two-axial directions.

In the present embodiment, GMR components are formed on the upper oxide film 11i; but this is not a restriction. That is, it is possible to form nitride films composed of $SiN_x$ (e.g. $Si_3N_4$) between the upper oxide film 11i and GMR components.

In the present embodiment, the polyimide film 11p is formed above the non-magnetic film 11r after the formation of the CVD oxide film 11o (composed of a $SiO_2$ film) and the nitride film 11s (composed of Si3N4); but this is not a restriction. For example, it is possible to form the polyimide film 11p only without forming the CVD oxide film 11o and the nitride film 11s.

The present embodiment is directed to GMR components of the SAF structure, in which a Ru layer is sandwiched between two CoFe magnetic layers forming the pin layer P; but this is not a restriction. For example, it can be applied to any types of GMR components not including Ru layers in pin layers. In addition, it can be applied to any types of magnetic sensors using tunnel magnetoresistive elements (TMR elements).

Lastly, the present invention is not necessarily limited to the present embodiment, which can be further modified in a variety of ways within the scope of the invention as defined in the appended claims.

What is claimed is:

1. A magnetic sensor comprising:
   a substrate;
   LSI components or wiring layers in the substrate;
   a silicon oxide film on the substrate, the silicon oxide film having a planar surface and a slope;
   a plurality of giant magnetoresistive elements, each of which includes, in order, a free layer adjacent the substrate, a conductive layer adjacent the free layer, a pin layer adjacent the conductive layer, and a capping layer adjacent the pin layer, wherein the plurality of giant magnetoresistive elements are located on the planar surface and the slope of the silicon oxide film and wherein a periphery of the free layer of each giant magnetoresistive element on the slope has a tapered shape;
   a plurality of lead films that connect the plurality of giant magnetoresistive elements in series;
   a CVD oxide film covering the plurality of giant magnetoresistive elements; and
   a non-magnetic film composed of Ta, Cr or Ti between the plurality of giant magnetoresistive elements and the CVD oxide film and covering at least the tapered periphery of the free layer with respect to each of the plurality of giant magnetoresistive elements.

* * * * *